US012641842B2

(12) United States Patent
Xie et al.

(10) Patent No.: US 12,641,842 B2
(45) Date of Patent: May 26, 2026

(54) BACKSIDE CONTACT THAT REDUCES RISK OF CONTACT TO GATE SHORT

(71) Applicant: INTERNATIONAL BUSINESS MACHINES CORPORATION, Armonk, NY (US)

(72) Inventors: Ruilong Xie, Niskayuna, NY (US); Shogo Mochizuki, Mechanicville, NY (US); Daniel Charles Edelstein, White Plains, NY (US); Lawrence A. Clevenger, Saratoga Springs, NY (US); Brent A. Anderson, Jericho, VT (US); Kisik Choi, Watervliet, NY (US); Chanro Park, Clifton Park, NY (US); Christian Lavoie, Pleasantville, NY (US); Cornelius Brown Peethala, Slingerlands, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 17/929,324

(22) Filed: Sep. 2, 2022

(65) Prior Publication Data
US 2024/0079446 A1     Mar. 7, 2024

(51) Int. Cl.
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ......... *H10D 62/121* (2025.01); *H10D 30/014* (2025.01); *H10D 30/43* (2025.01); *H10D 30/6757* (2025.01); *H10D 64/018* (2025.01)

(58) Field of Classification Search
CPC ........ H10D 30/501–509; H10D 30/019–0198; H10D 30/43–435; H10D 62/119–123; H10D 30/014; Y10S 977/938
See application file for complete search history.

(56) References Cited

U.S. PATENT DOCUMENTS

| 9,466,723 | B1 | 10/2016 | Huang et al. |
| 10,957,575 | B2 | 3/2021 | Yakimets et al. |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2021/0391421 | A1 | 12/2021 | Chu et al. |
| 2021/0399099 | A1* | 12/2021 | Chu ................... H10D 30/6729 |
| 2021/0408246 | A1 | 12/2021 | Ganguly et al. |

(Continued)

*Primary Examiner* — Matthew C Landau
*Assistant Examiner* — Nora T. Nix
(74) *Attorney, Agent, or Firm* — Cantor Colburn LLP; Samuel Waldbaum

(57) ABSTRACT

Embodiments of the invention include a transistor comprising a gate region and an epitaxial region, the transistor comprising a frontside opposite a backside. A backside contact is coupled to the epitaxial region and separated from the gate region by a bottom dielectric isolation layer and a backside protective spacer.

18 Claims, 35 Drawing Sheets

(56)     References Cited

U.S. PATENT DOCUMENTS

| | | | |
|---|---|---|---|
| 2022/0028786 A1* | 1/2022 | Huang | H10D 30/024 |
| 2022/0139911 A1* | 5/2022 | Wei | H01L 23/5226 |
| | | | 257/365 |
| 2022/0165856 A1 | 5/2022 | Yu et al. | |

* cited by examiner

100

100

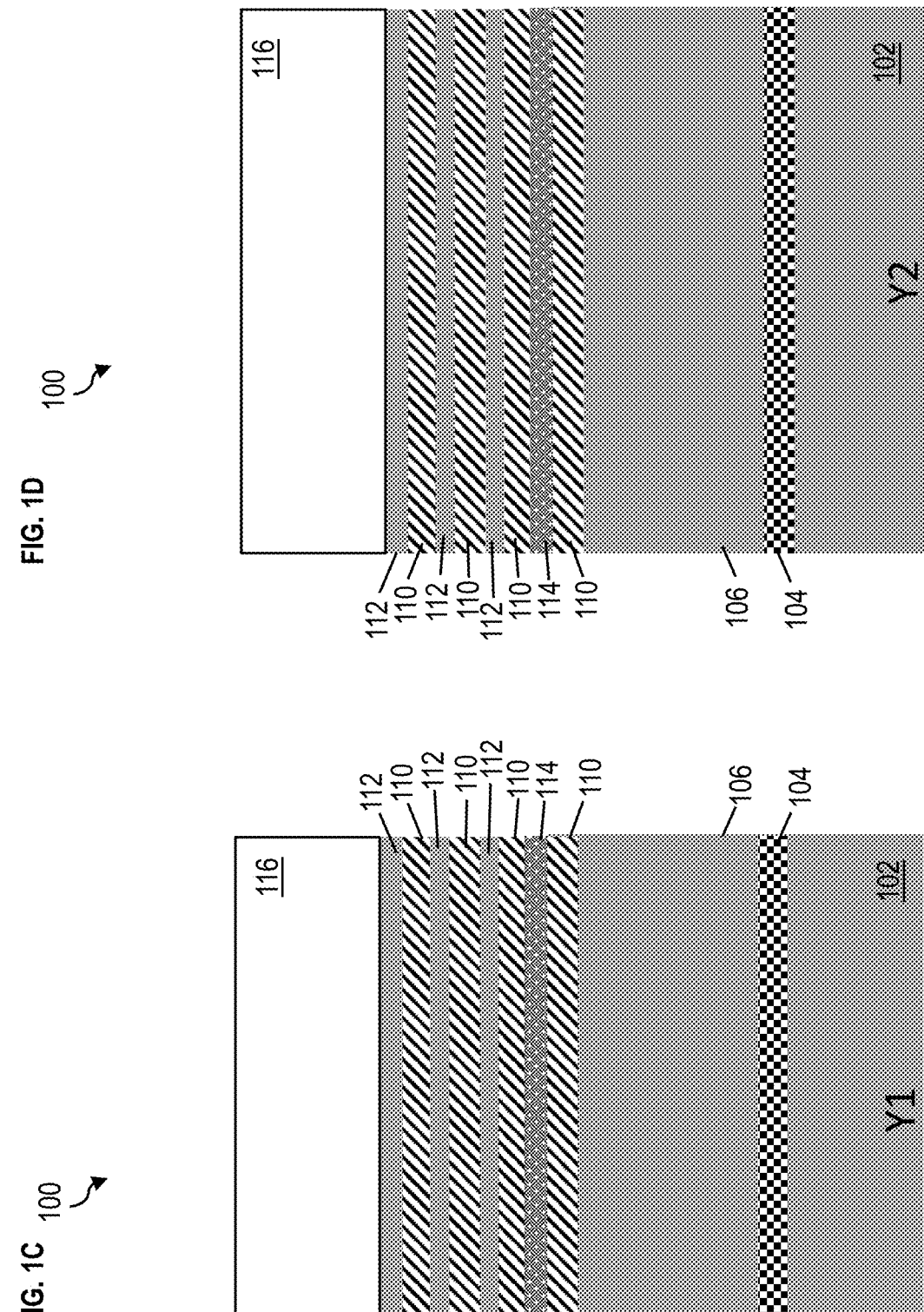

100

250

112
110
112
110
112
110
114
110

106
104

102

X

100

NFET

NFET

PFET

PFET

X

Y1  Y2

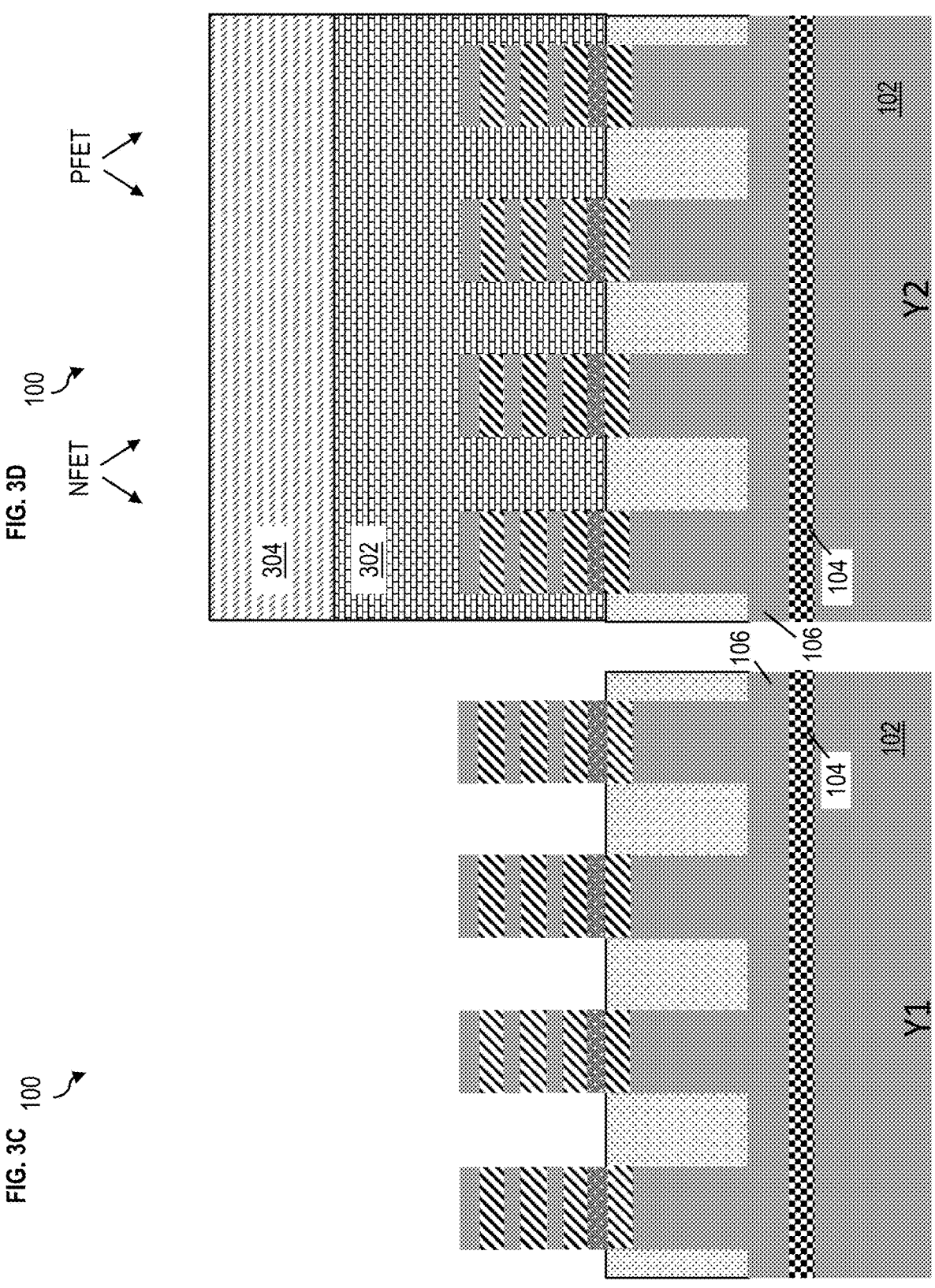

100

100

100

502
304
302
112
110
112
110
112
110
502
110
106
104

102

X

250

100

NFET

NFET

PFET

PFET

X

Y1  Y2

100

702
502
304
302
112
110
112
110
112
110
502
110
106
104
704
X
102

100

NFET
NFET
PFET
PFET
X
Y1  Y2

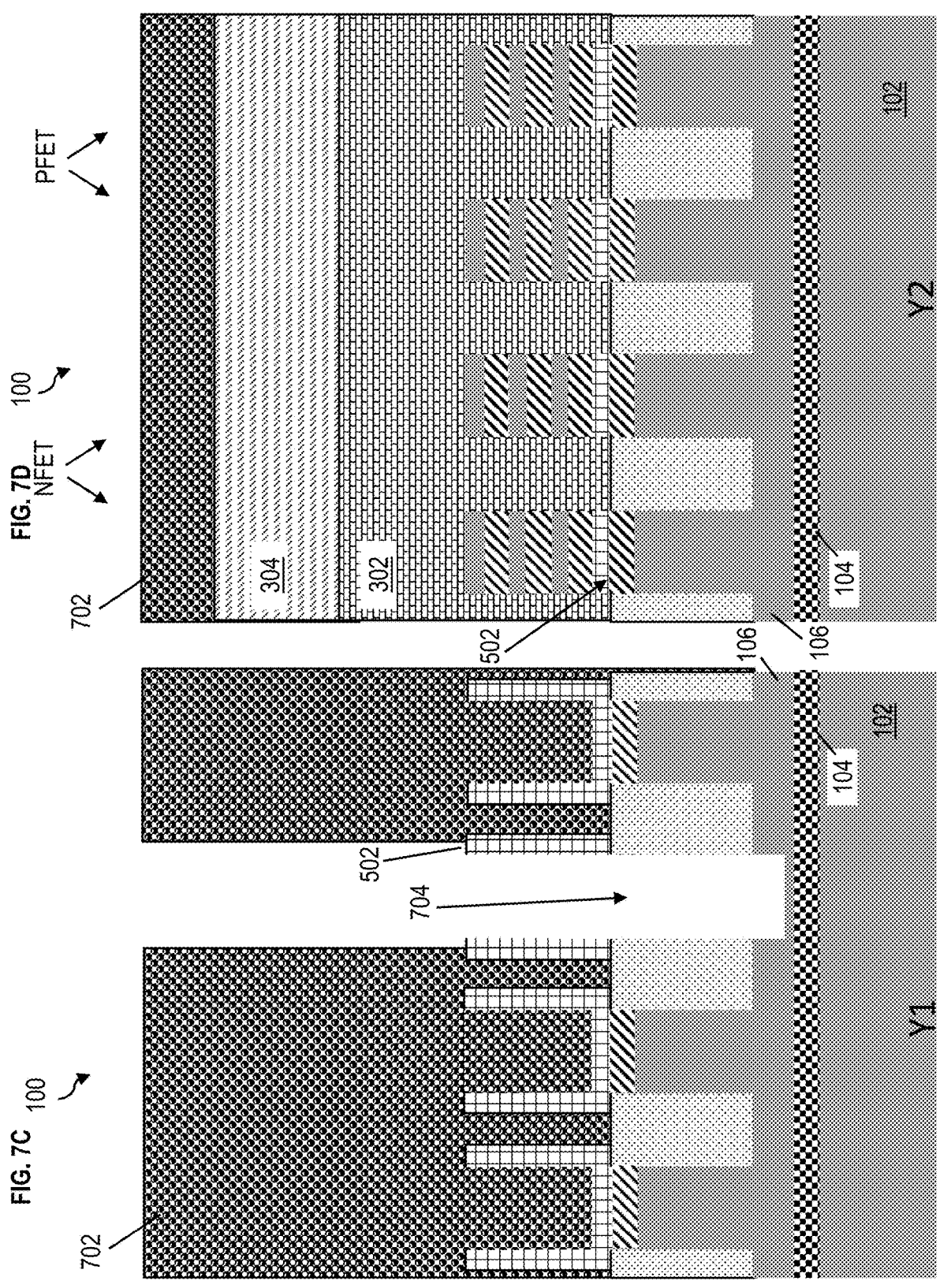

100

100

100

502

304

302

112
802
112
802
112
802
502
110

110

802

902

106

104

102

X

100

NFET

NFET

PFET

PFET

X

Y1 Y2

100

100

PFET

NFET

100

302

502

106

106

104

102

Y2

100

1002

1002

1003

1003

1004

902

104

102

Y1

100

1104
502
1102
112
802
112
802
112
802
502
110
106
104

1122
1120
1110
1002
802
902
102
X

100

NFET
NFET
PFET
PFET

X
Y1 Y2

FRONT SIDE

100

1122
1120
1110
1002
802
902
1104
502
1102
112
802
112
802
112
802
502
110
106
104

BACKSIDE

X

100

NFET

NFET

PFET

PFET

X

Y1  Y2

100

1122

1120

1110

1002

802

902

1104

502

1102

112
802
112
802
112
802
502

1402

X

100

NFET

NFET

PFET

PFET

X

Y1 Y2

Y2

Y1

100

1122

1120

1110

1104

502

1102

112

802

112

802

112

802

502

1402

1002

802

1502

X

100

NFET

NFET

PFET

PFET

X

Y1  Y2

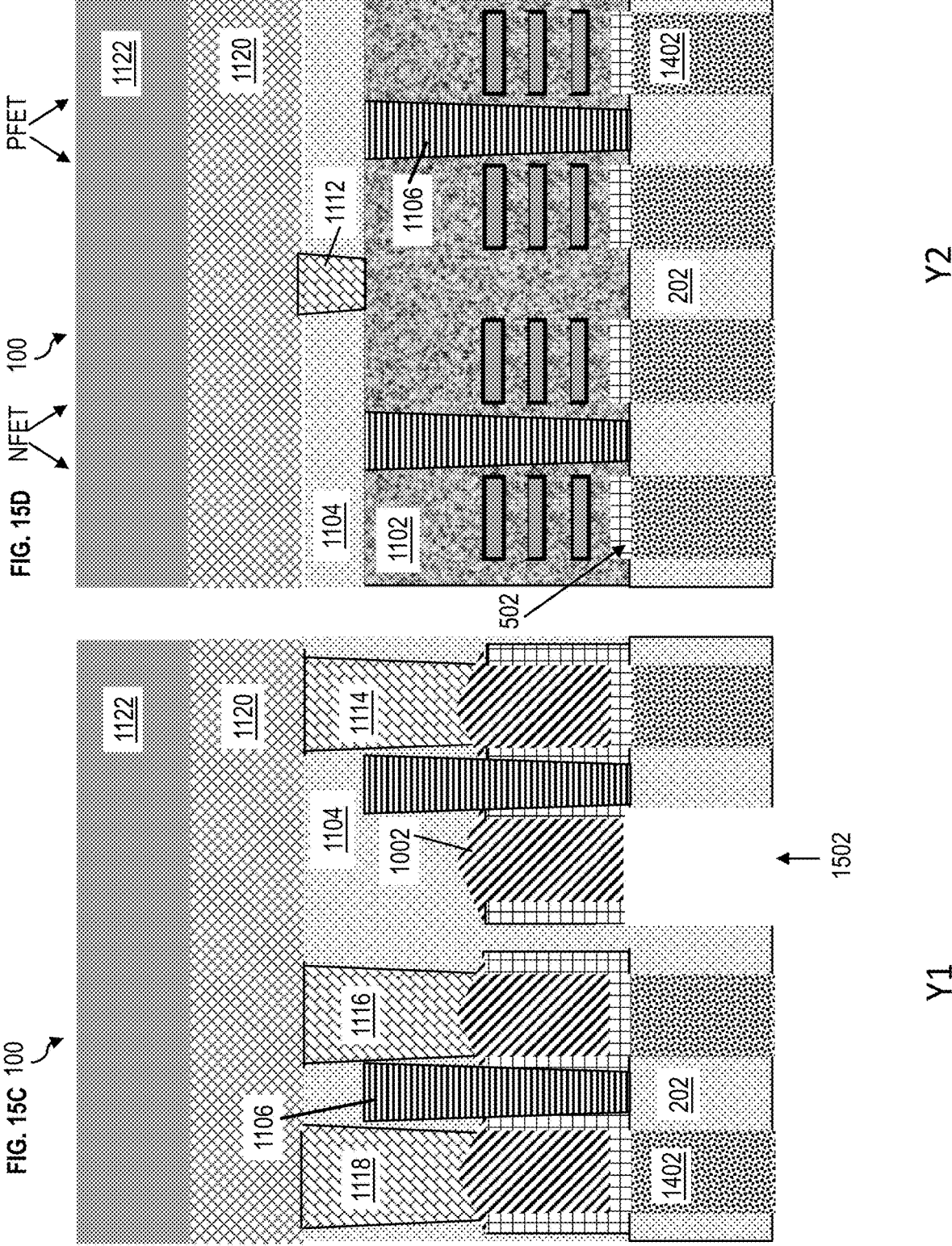

Y2

Y1

1800

FORM A TRANSISTOR COMPRISING A GATE REGION AND AN EPITAXIAL REGION, THE TRANSISTOR COMPRISING A FRONTSIDE OPPOSITE A BACKSIDE   1802

PROVIDE A BACKSIDE CONTACT COUPLED TO THE EPITAXIAL REGION AND SEPARATED FROM THE GATE REGION BY A BOTTOM DIELECTRIC ISOLATION LAYER AND A BACKSIDE PROTECTIVE SPACER   1804

BACKSIDE CONTACT THAT REDUCES RISK OF CONTACT TO GATE SHORT

BACKGROUND

The present invention generally relates to fabrication methods and resulting structures for integrated circuits (ICs), and more specifically, to fabrication methods and resulting structures configured and arranged to provide a backside contact that reduces the risk of contact to gate short.

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

SUMMARY

Embodiments of the present invention are directed to providing fabrication methods and resulting structures for a backside contact that reduces the risk of contact to gate short. A non-limiting method includes providing a transistor comprising a gate region and an epitaxial region, the transistor comprising a frontside opposite a backside. The method includes providing a backside contact coupled to the epitaxial region and separated from the gate region by a bottom dielectric isolation layer and a backside protective spacer.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A, 1B, 1C, and 1D respectively depict a top view and cross-sectional views of a portion of an integrated circuit (IC) under-fabrication after fabrication operations according to one or more embodiments of the invention;

FIGS. 3A, 3B, 3C, and 3D respectively depict a top view and cross-sectional views of a portion of an IC under-fabrication after fabrication operations according to one or more embodiments of the invention;

FIGS. 7A, 7B, 7C, and 7D respectively depict a top view and cross-sectional views of a portion of an IC under-fabrication after fabrication operations according to one or more embodiments of the invention;

FIGS. 15A, 15B, 15C, and 15D respectively depict a top view and cross-sectional views of a portion of an IC under-fabrication after fabrication operations according to one or more embodiments of the invention;

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments provide fabrication methods and resulting structures for a backside contact that reduces the risk of a backside contact to gate short. To form the backside contact, a semiconductor device is fabricated by forming a nanosheet stack including a bottom sacrificial layer, a bottom dielectric isolation sacrificial layer, and nanosheet alternative SiGe/Si layers. The fabrication includes forming a dummy gate. Fabrication includes removing the bottom dielectric isolation sacrificial layer and forming a bottom dielectric isolation layer. A backside contact trench is formed through the bottom dielectric isolation layer into the substrate. SiGe spacers (indentation) are formed in the ends of the bottom dielectric isolation layer. The fabrication includes forming backside contact protective spacers under the bottom dielectric isolation layer and forming a backside contact placeholder next to the backside contact protective spacers. The fabrication includes flipping the wafer, removing the substrate, removing the backside contact placeholder, and forming a backside contact, which is separated from gate by the backside contact protective spacers and backside dielectric isolation layer.

A self-aligned backside contact is the next interconnect to be utilized for the industry. However, the backside contact to gate short is a risk factor in the use of backside contacts, especially as numerous transistors as produced. Accordingly, one or more embodiments provide a semiconductor structure formed with an additional backside protective spacer to alleviate the risk of a backside contact to gate short, thereby improving the connection to the transistor.

Figure 1B:
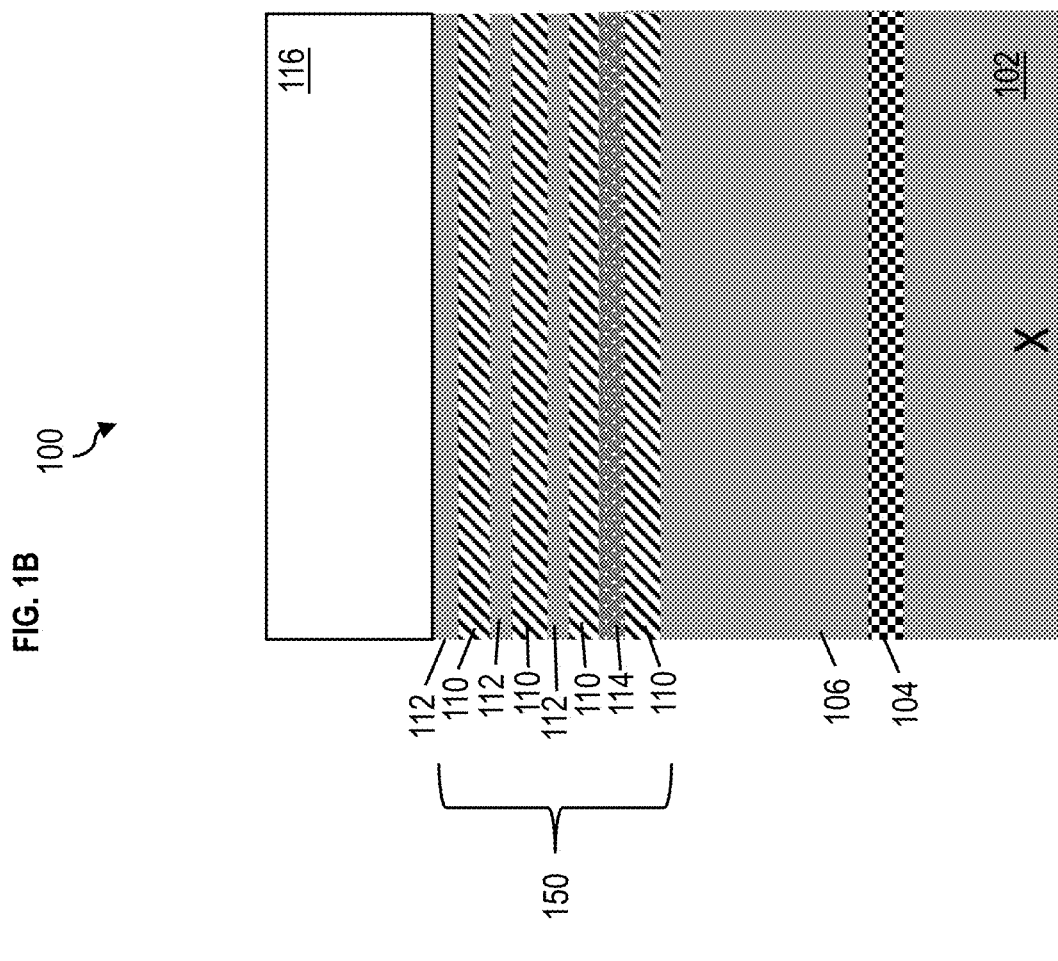
Figure 1A:
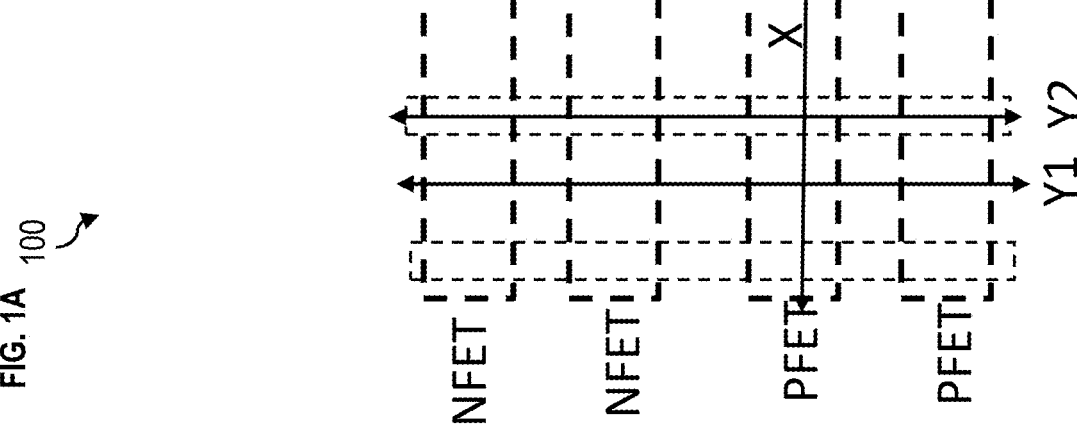
Figure 2B:
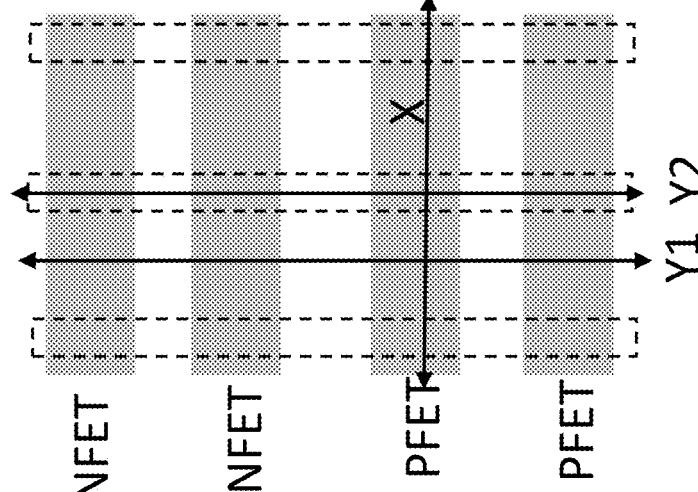
FIGS. 2A, 2B, 2C, and 2D respectively depict a top view and cross-sectional views of a portion of an IC under-fabrication after fabrication operations according to one or more embodiments of the invention.
Figure 2A:
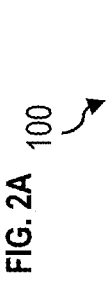
Figures 2C, 2D:
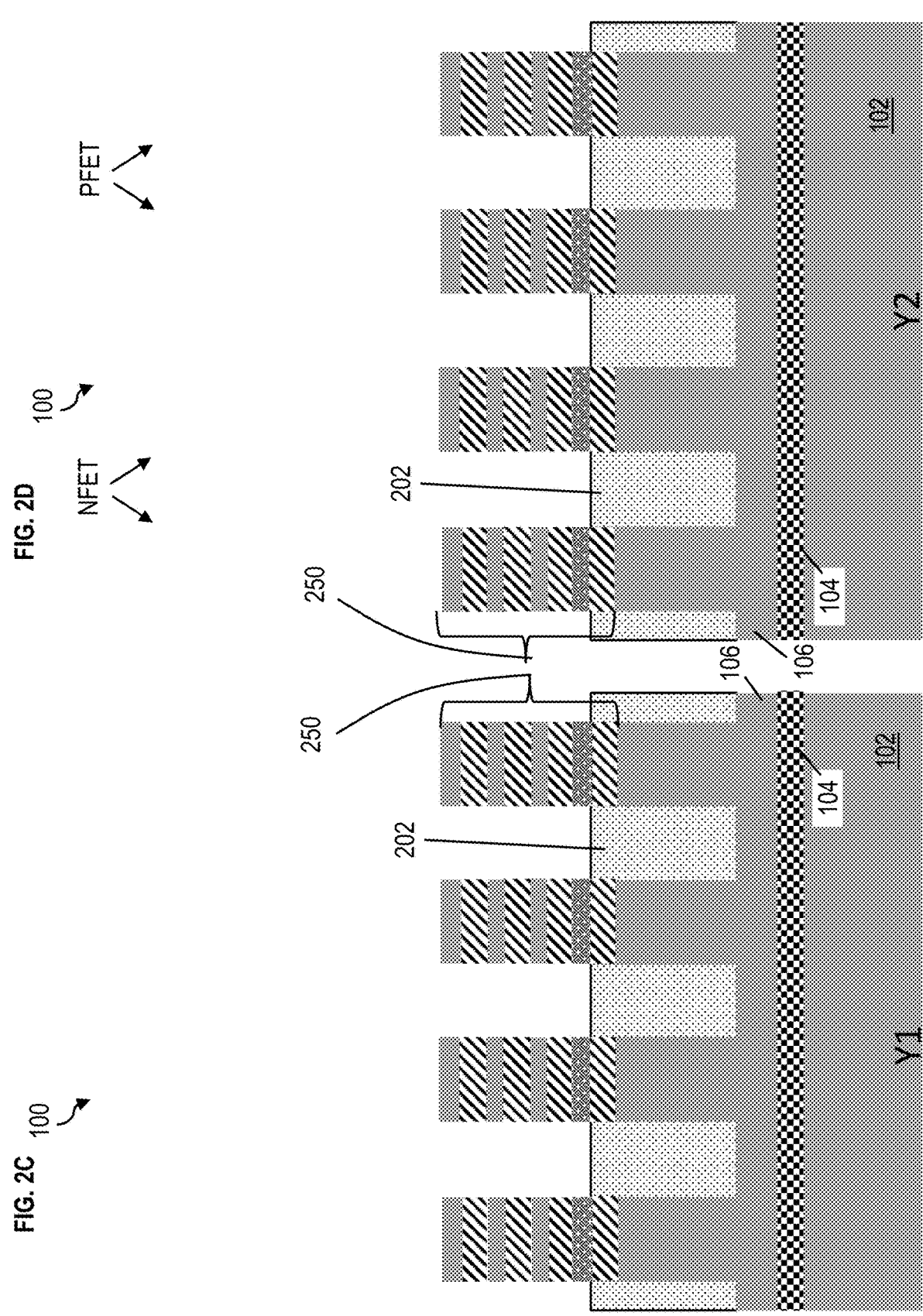
Figures 3A, 3B:
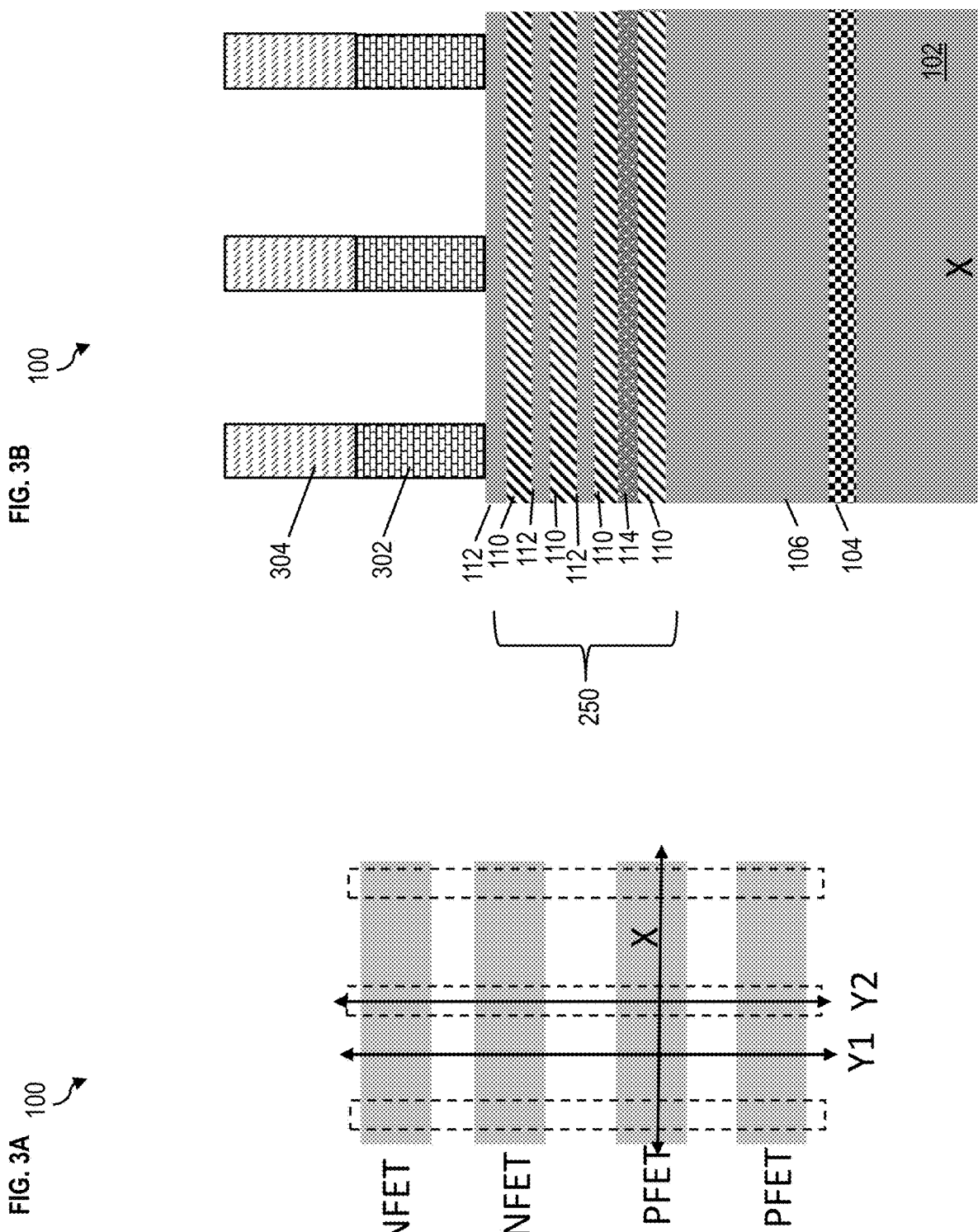
Figures 4A, 4B:
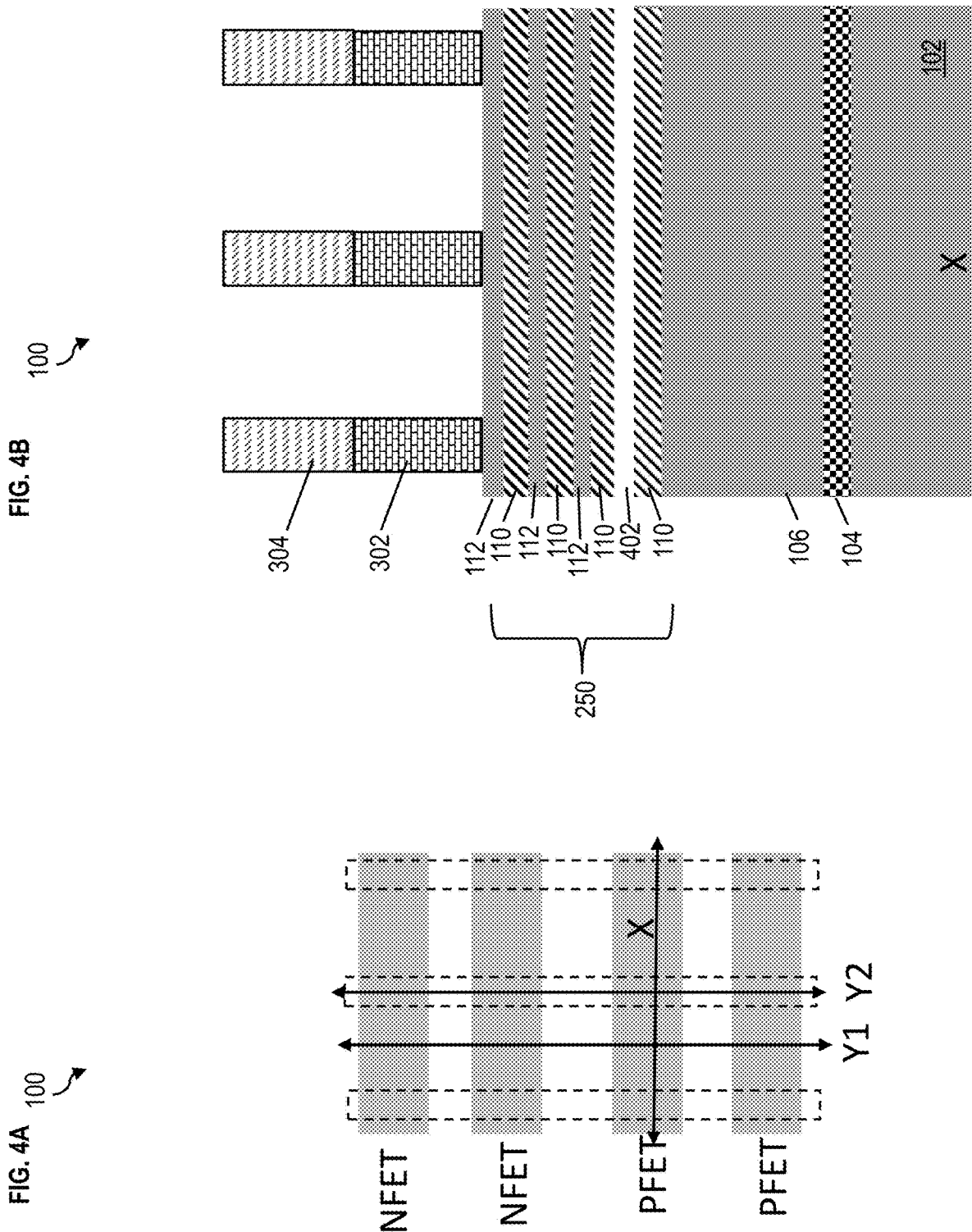
FIGS. 4A, 4B, 4C, and 4D respectively depict a top view and cross-sectional views of a portion of an IC under-fabrication after fabrication operations according to one or more embodiments of the invention.
Figures 4C, 4D:
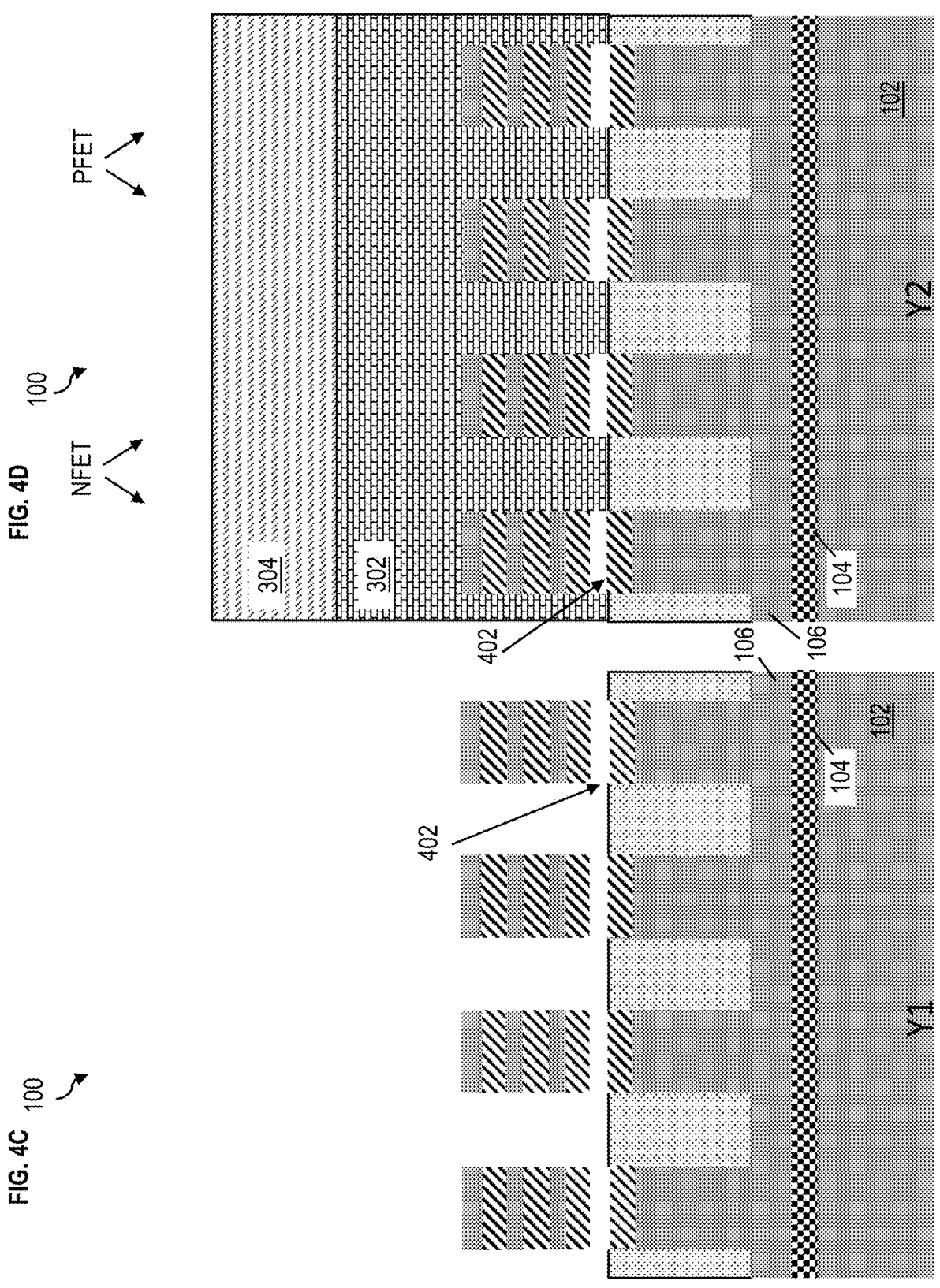
Figures 5A, 5B:
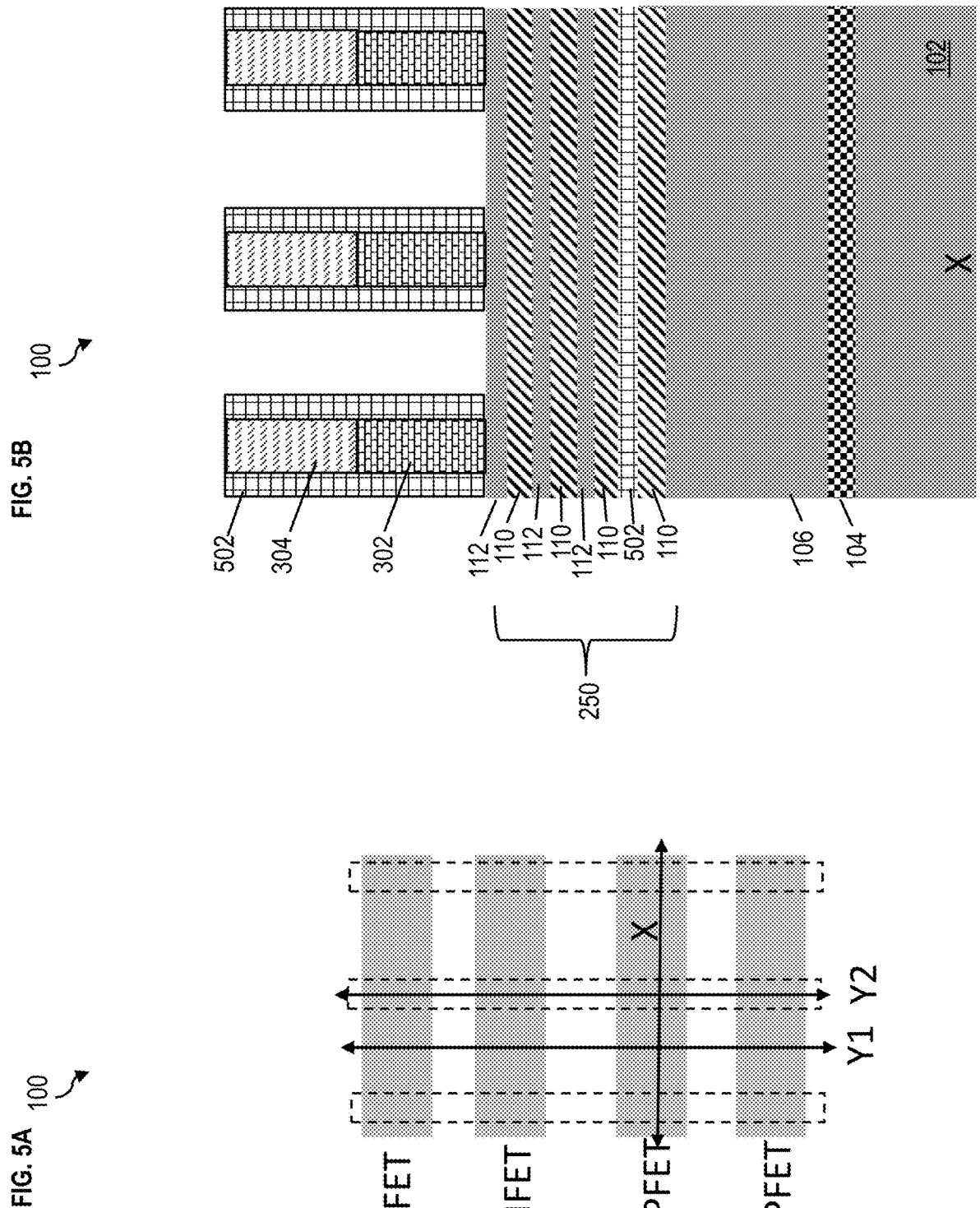
FIGS. 5A, 5B, 5C, and 5D respectively depict a top view and cross-sectional views of a portion of an IC under-fabrication after fabrication operations according to one or more embodiments of the invention.
Figures 5C, 5D:
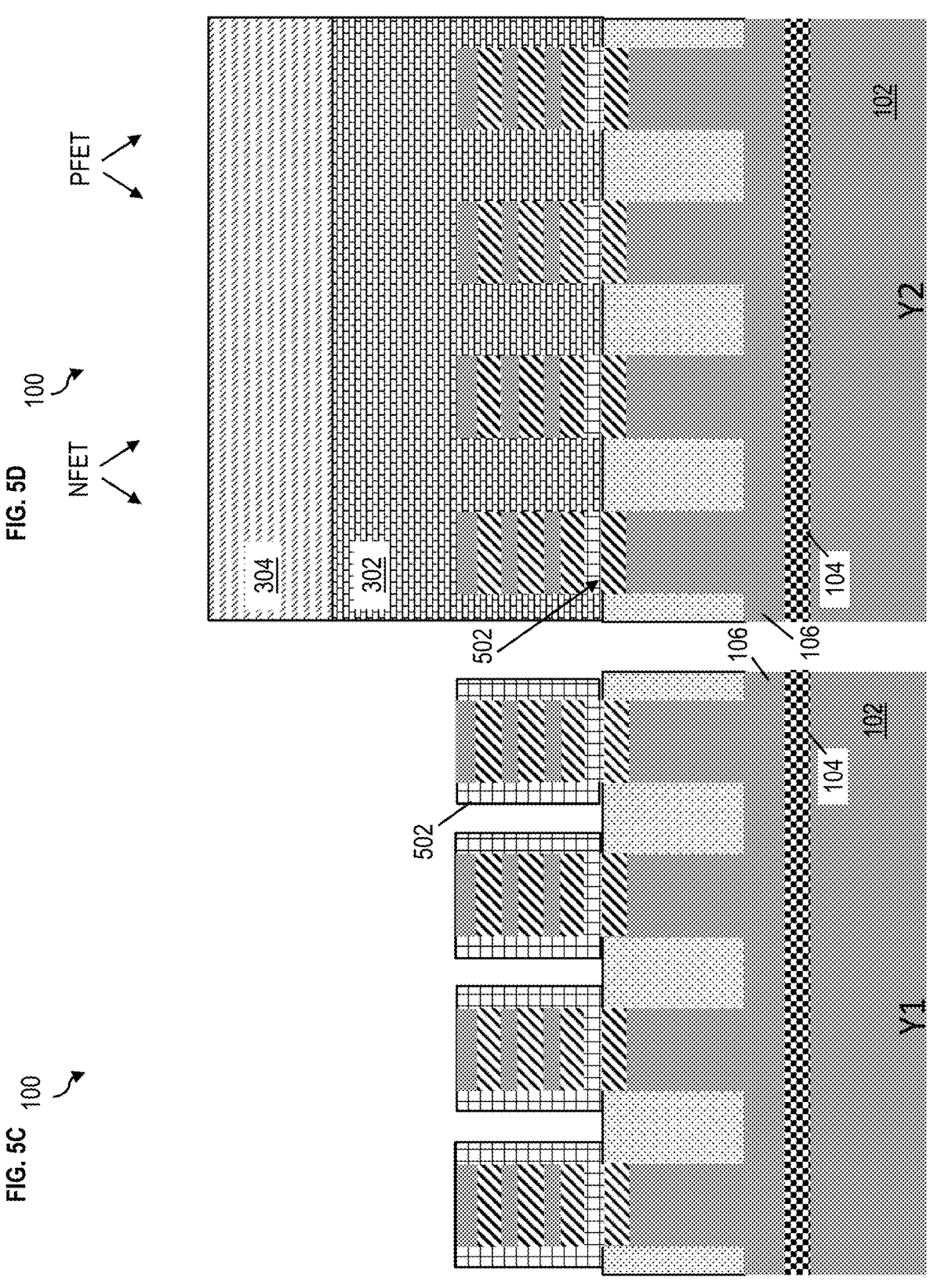
Figures 6A, 6B:
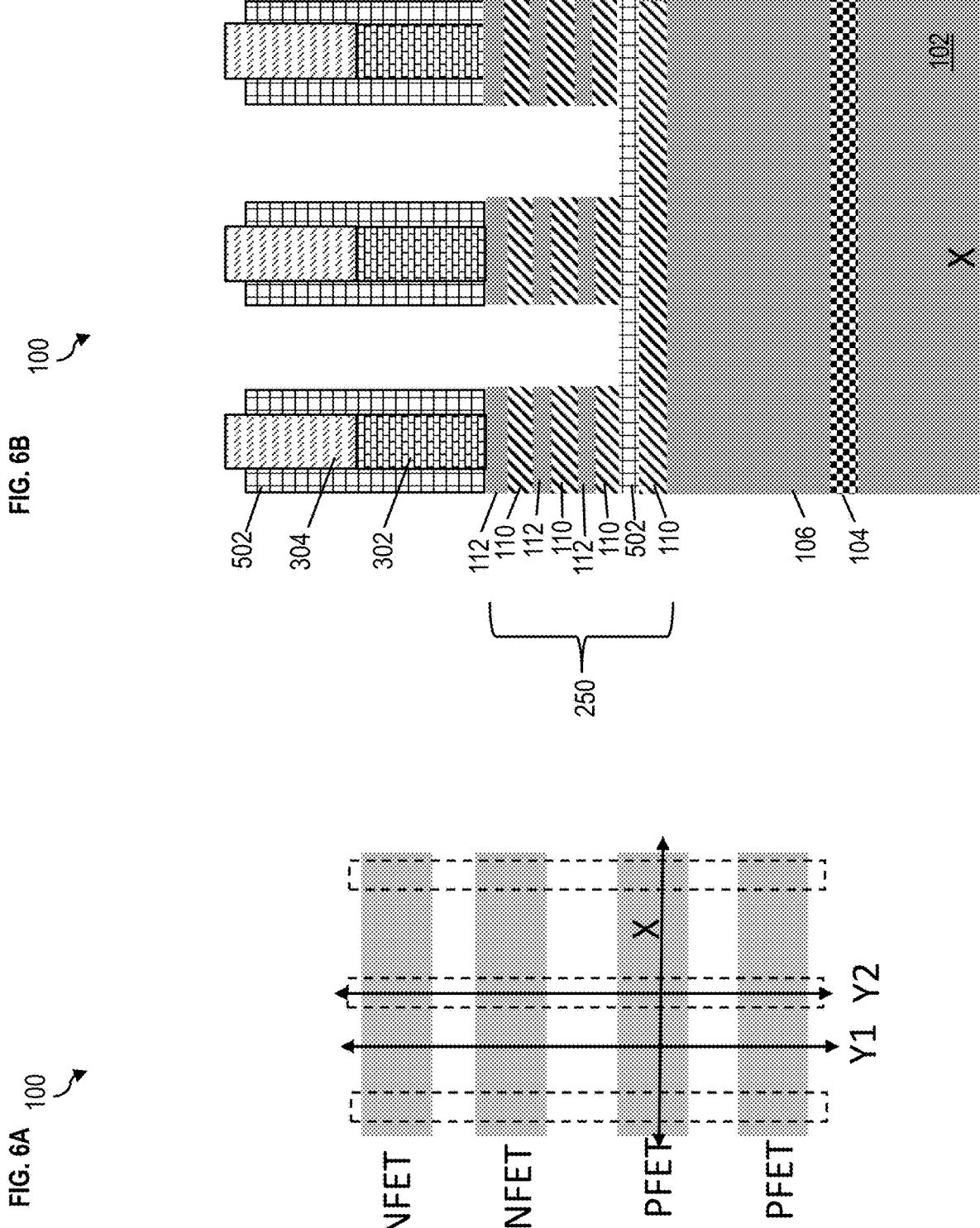
FIGS. 6A, 6B, 6C, and 6D respectively depict a top view and cross-sectional views of a portion of an IC under-fabrication after fabrication operations according to one or more embodiments of the invention.
Figures 6C, 6D:
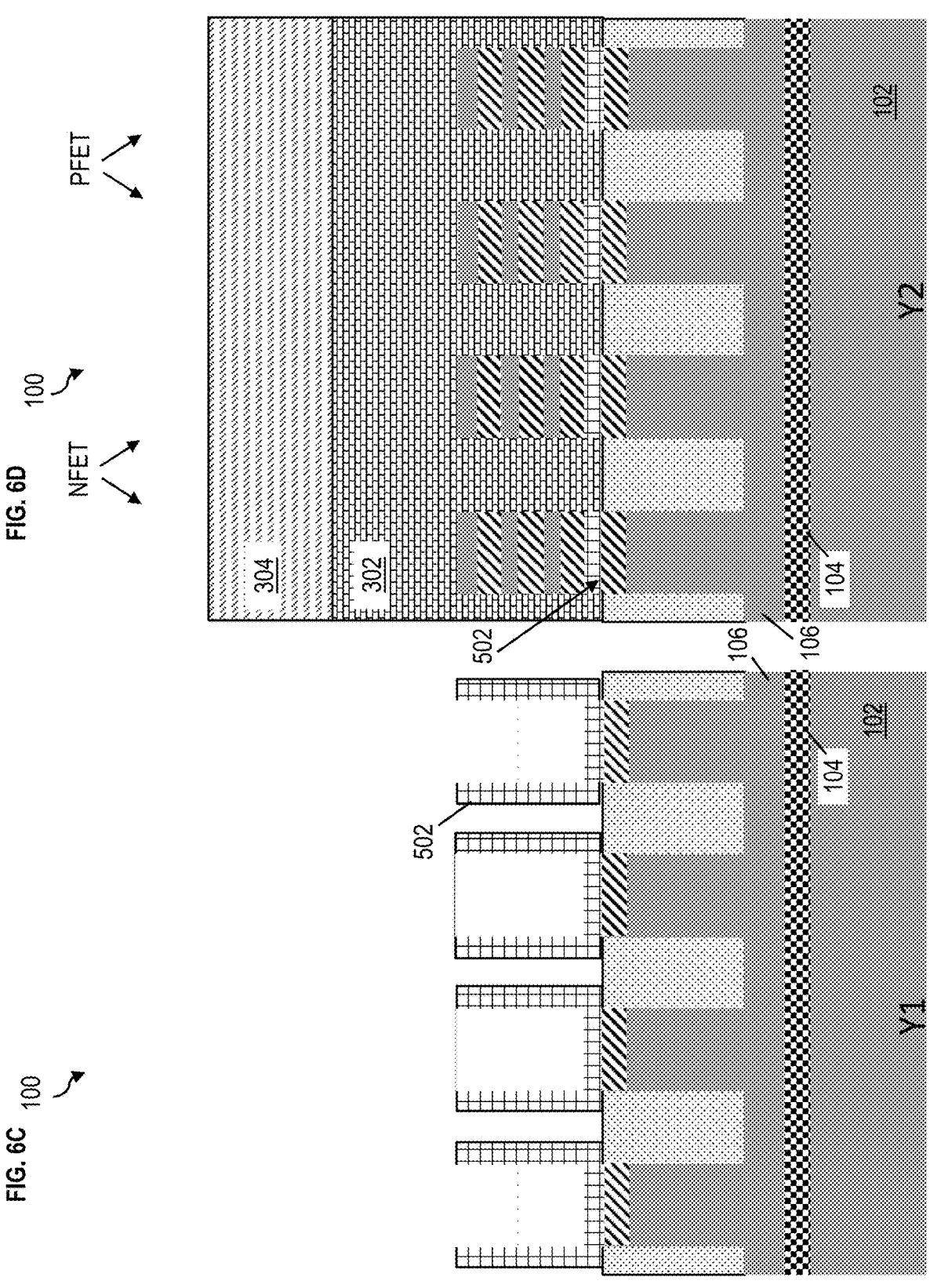
Figure 7B:
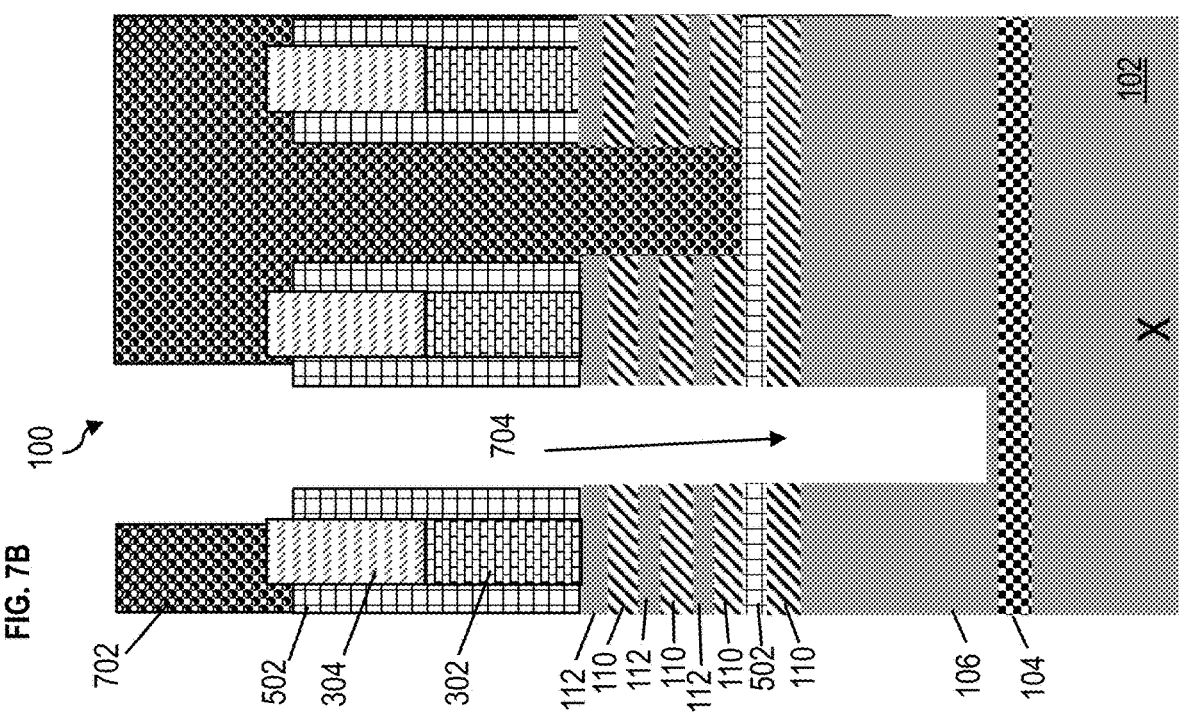
Figure 7A:
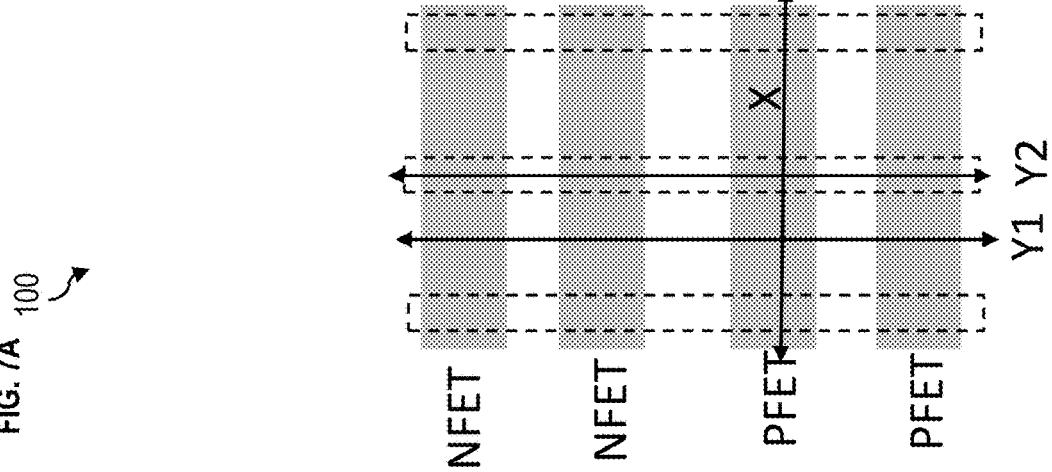

Turning now to a more detailed description of aspects of the present invention, FIG. 1A depicts a top view of a simplified illustration of a portion of an integrated circuit (IC) 100, FIG. 1B depicts a cross-sectional view taken along X of the IC 100, FIG. 1C depicts a cross-sectional view taken along Y1 of the IC 100, and FIG. 1D depicts a cross-sectional view taken along Y2 of the IC 100. For ease of understanding, some layers may be omitted from the various top views so as not to obscure the figure and to view layers underneath. As such, the top view is intended to provide a simplified illustration and a general orientation. Standard semiconductor fabrication techniques can be utilized to fabricate IC 100 as understood by one of ordinary skill in the art. Any suitable lithography processes including deposition techniques and etching techniques can be utilized herein.

FIGS. 1A, 1B, 1C, and 1D depict the IC 100 with a start wafer where several fabrication processes have been performed. A nanosheet stack 150 is formed. The nanosheet stack 150 is formed on a substrate 102, and a hard mask layer 116 is formed on top. The wafer or substrate 102 may be formed of silicon with an etch stop layer 104 in between. Further material of the substrate 102 is formed on top of the etch stop layer 104 as substrate 106. The substrates 102, 106 can be (pure) silicon. Other suitable materials can be utilized for the substrates 102, 106. The etch stop layer can be a silicon germanium (SiGe) layer, and in this case, layers 102 and 106 are epitaxially grown over initial substrate 102. In other embodiments, the etch stop layer can be $SiO_2$, and in this case, the starting wafer is an SOI wafer comprising Si substrate 102, buried oxide (BOX) 104, and silicon on insulator 106.

Initially, the nanosheet stack 150 includes layer 114 formed in between layers 110. The nanosheet stack 150 includes alternating layers 110 and 112 formed above layer 112. The layers 112 are semiconductor material and may be substantially pure silicon. The layers 112 are to be utilized as the channel regions for the FET device. The layers 110 are sacrificial layers formed of silicon germanium (SiGe) where germanium has an atomic percent (%) of about 30%, thereby leaving silicon with an atomic percent of about 70%. In layers 110, the atomic percent of germanium may range from about 20-35%, while silicon is the remainder. The layer 114 (which is a placeholder for the bottom dielectric isolation layer) is a sacrificial layer formed of silicon germanium, where the atomic percent of germanium is about 55%. In layer 114, the atomic percent of germanium may range from about 50-65%, while silicon is the remainder. In one or more embodiments, the thicknesses of semiconductor layers 110, 112, 114 may be about the same. In one or more embodiments, the thicknesses of the semiconductor layers 110, 112, 114 may vary depending upon the particular application and they need not have the same thicknesses.

FIGS. 2A, 2B, 2C, and 2D depict the IC 100 after nanosheet patterning and shallow trench isolation formation. Using a patterned hard mask layer 116, fin patterning is performed to form nanosheets stacks 250 from the nanosheet stack 150. Further etching is performed to generate cavities in which to form shallow trench isolation (STI) regions 202. The STI regions 202 may include one or more dielectric materials such as $SiO_2$. The STI regions 202 may include a low-k or ultralow-k dielectric material.

FIGS. 3A, 3B, 3C, and 3D depict the IC 100 after dummy gate formation. Sacrificial gate structures 302, also referred to as dummy gates, are formed on the nanosheet stacks 250. The sacrificial gate structures 302 are sacrificial in nature in that they are replaced at a later point in the process flow with other materials to form functional gate structures, as described below. Sacrificial gate structures 302 may include one or more layers of material, such as a sacrificial gate insulation layer (e.g., silicon dioxide) and/or a sacrificial gate material (e.g., amorphous silicon) which are not separately shown. A gate hard mask layer 304 (e.g., silicon nitride or a stack including silicon nitride and silicon dioxide) is deposited over the sacrificial gate structure 302. The gate hard mask layer 304 and sacrificial gate structures 302 are subsequently patterned by a conventional lithography and etch process.

FIGS. 4A, 4B, 4C, and 4D depict the IC 100 after removal of the sacrificial layer 114. A selective etch is performed to remove sacrificial layer 114. For example, an isotropic etch may be performed to remove sacrificial layer 114 while not removing layers 104, 110, 112, thereby creating cavities 402. An example etchant that selectively etches layer 114 may include vapor phased HCl at a suitable temperature and pressure.

FIGS. 5A, 5B, 5C, and 5D depict the IC 100 after spacer deposition. Dielectric material is formed as gate spacer material 502 in the cavities 402 and on the sacrificial gate structure 302, the gate hard mask layer 304, and the nanosheet stacks 250. The gate spacer material 502 serves as the bottom dielectric isolation layer that separates two of the bottom layers 110. Gate spacer material and the bottom dielectric isolation layer may be utilized interchangeably. Example materials of the gate spacer material/bottom dielectric isolation layer 502 may include SiN, SiBCN, SiOCN, SiOC, etc.

FIGS. 6A, 6B, 6C, and 6D depict the IC 100 after nanosheet stack recess. The nanosheet stacks 250 are etched at locations where the gate hard mask layer 304 and gate space material 502 are absent, which is in preparation for further etching for the backside contact trench. The etching is down to and exposes the gate spacer material 502 (i.e., the bottom dielectric isolation layer).

FIGS. 7A, 7B, 7C, and 7D depict the IC 100 after backside contact trench patterning. A mask layer 702 is deposited and etched. The mask layer 702 may be an organic patterning layer (OPL) and/or any suitable material or combination of materials. An anisotropic etch may be utilized to etch the mask layer 702. Using the patterned mask layer 702 as a mask, further etching etch is performed through exposed portions of the gate spacer material 502, layer 110, and substrate 106, so as to stop on the etch stop layer 104, resulting in a backside contact trench 704. The depth of the backside contact trench 704 does not expose the etch stop layer 104, because the etch stop layer can optionally be SiGe, which might be damaged in subsequent processing (e.g., in FIG. 8); particularly, the SiGe indentation process may damage the etch stop layer 104 (when the material is SiGe).

FIGS. 8A, 8B, 8C, and 8D depict the IC 100 after SiGe indention and subsequent inner spacer formation. An isotropic etch process is performed to selectively recess the layers 110 in order to define end cavities on ends thereof. A conformal deposition process, such as an ALD process, is performed to form a layer of inner spacer material on the nanosheet stacks 250, and the inner spacer material is isotropically etched to define inner spacers 802 in the end cavities. Example materials of the inner spacers 802 may include SiBCN, SiOCN, SiN, SiOC, SiC, etc.

Figure 8B:
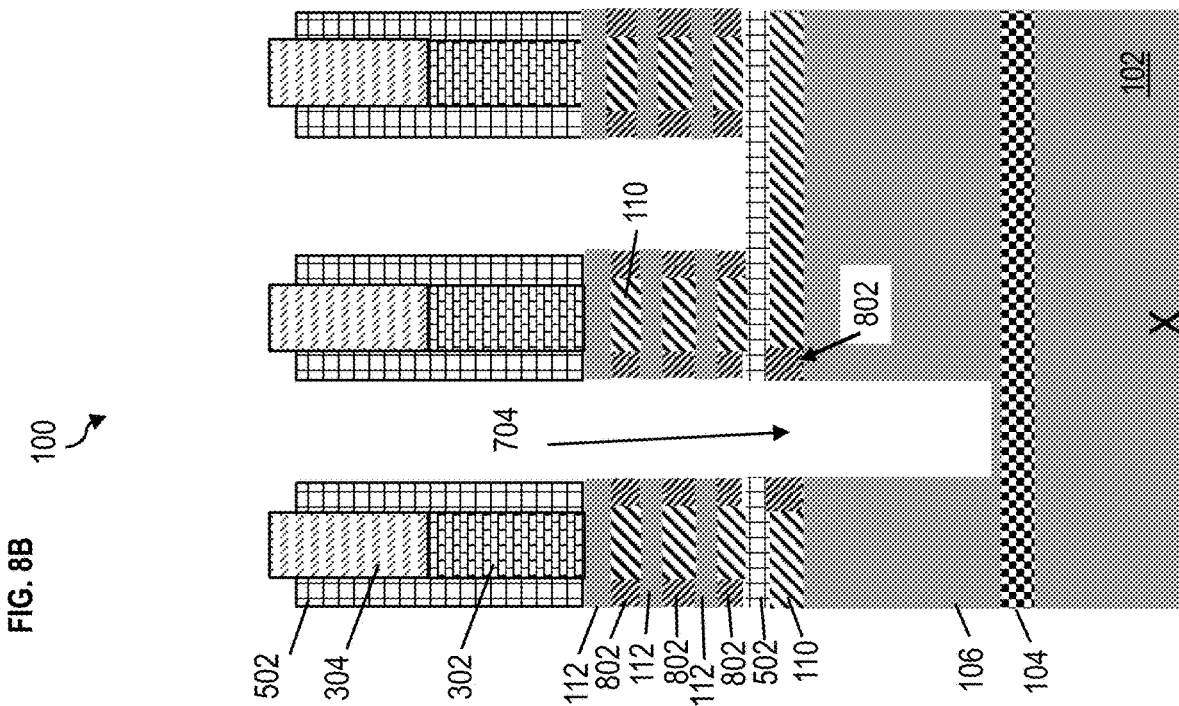
FIGS. 8A, 8B, 8C, and 8D respectively depict a top view and cross-sectional views of a portion of an IC under-fabrication after fabrication operations according to one or more embodiments of the invention.
Figure 8A:
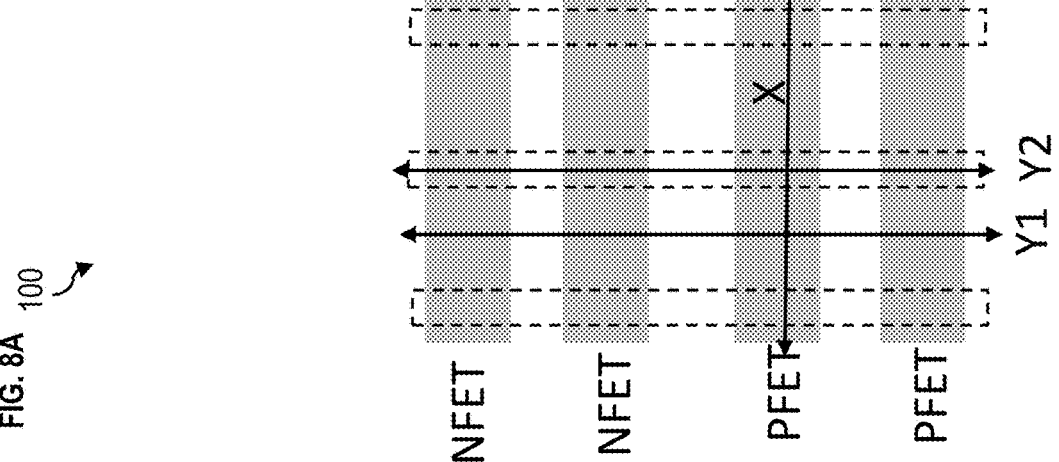
Figures 8C, 8D:
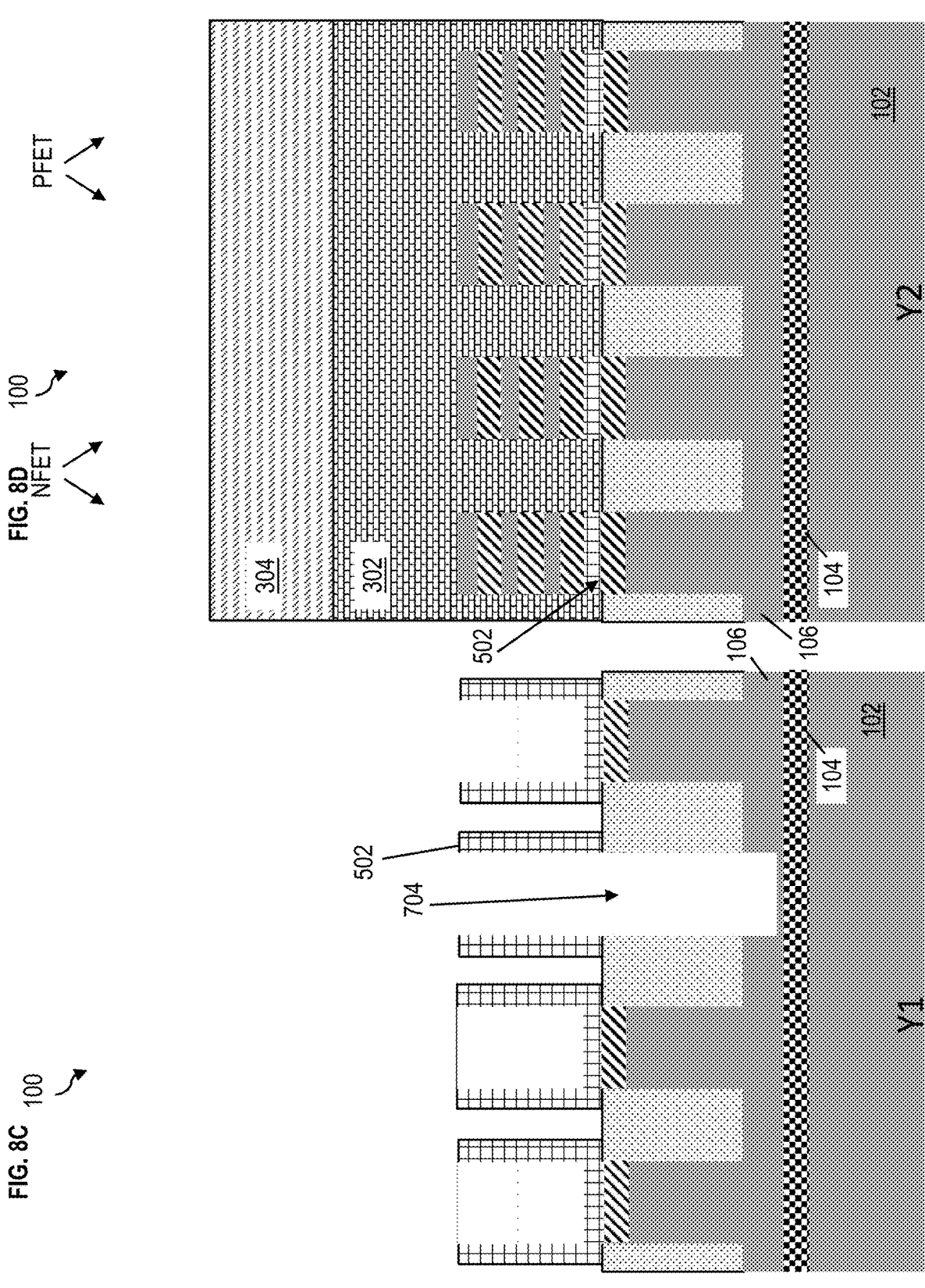
Figure 9B:
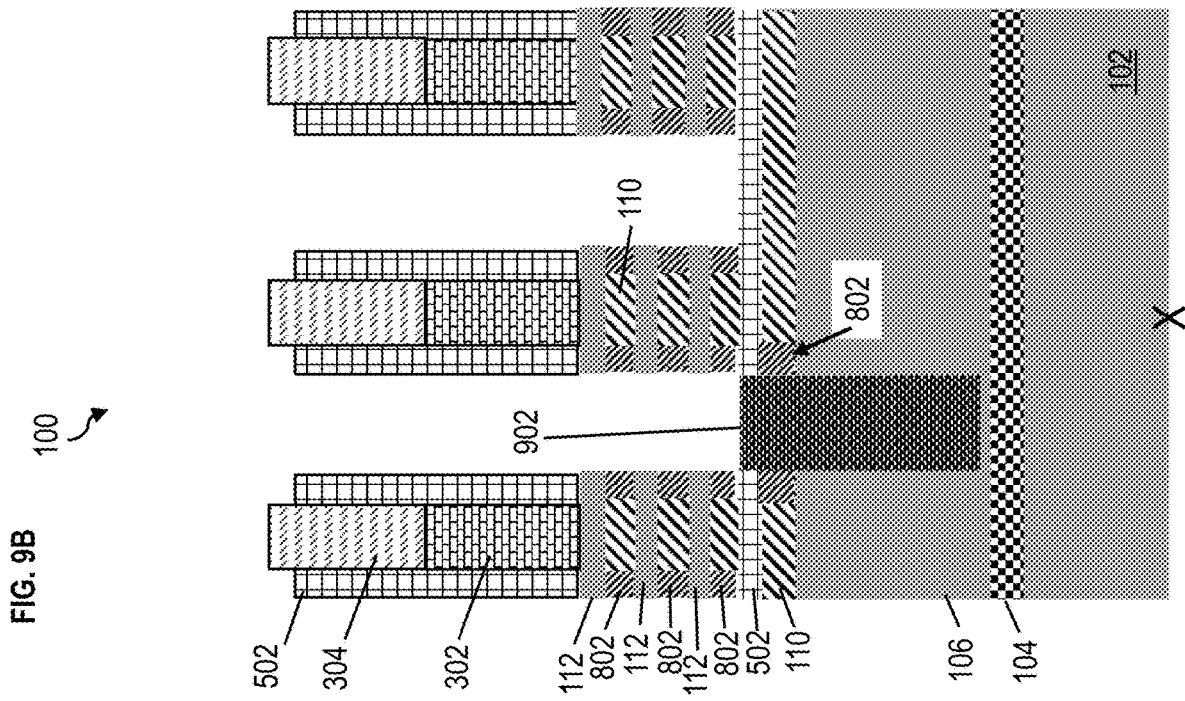
FIGS. 9A, 9B, 9C, and 9D respectively depict a top view and cross-sectional views of a portion of an IC under-fabrication after fabrication operations according to one or more embodiments of the invention.
Figure 9A:
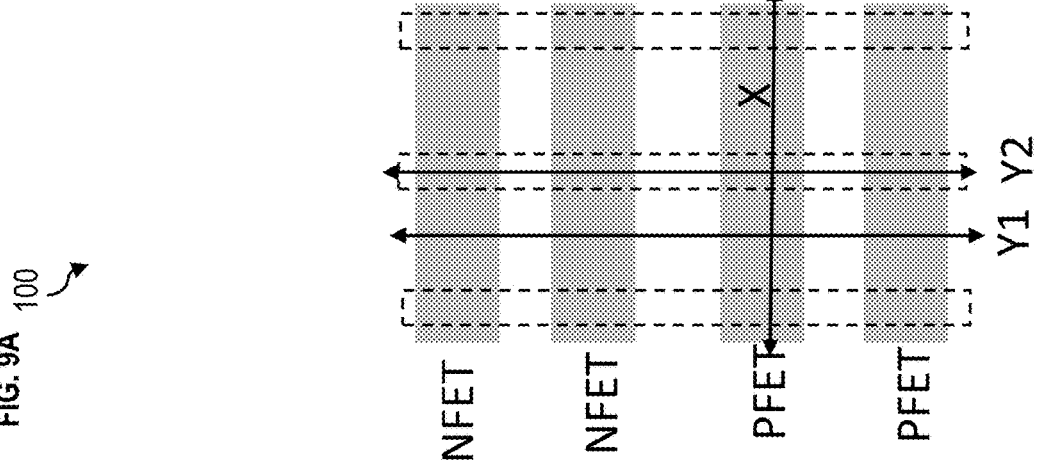
Figures 9C, 9D:
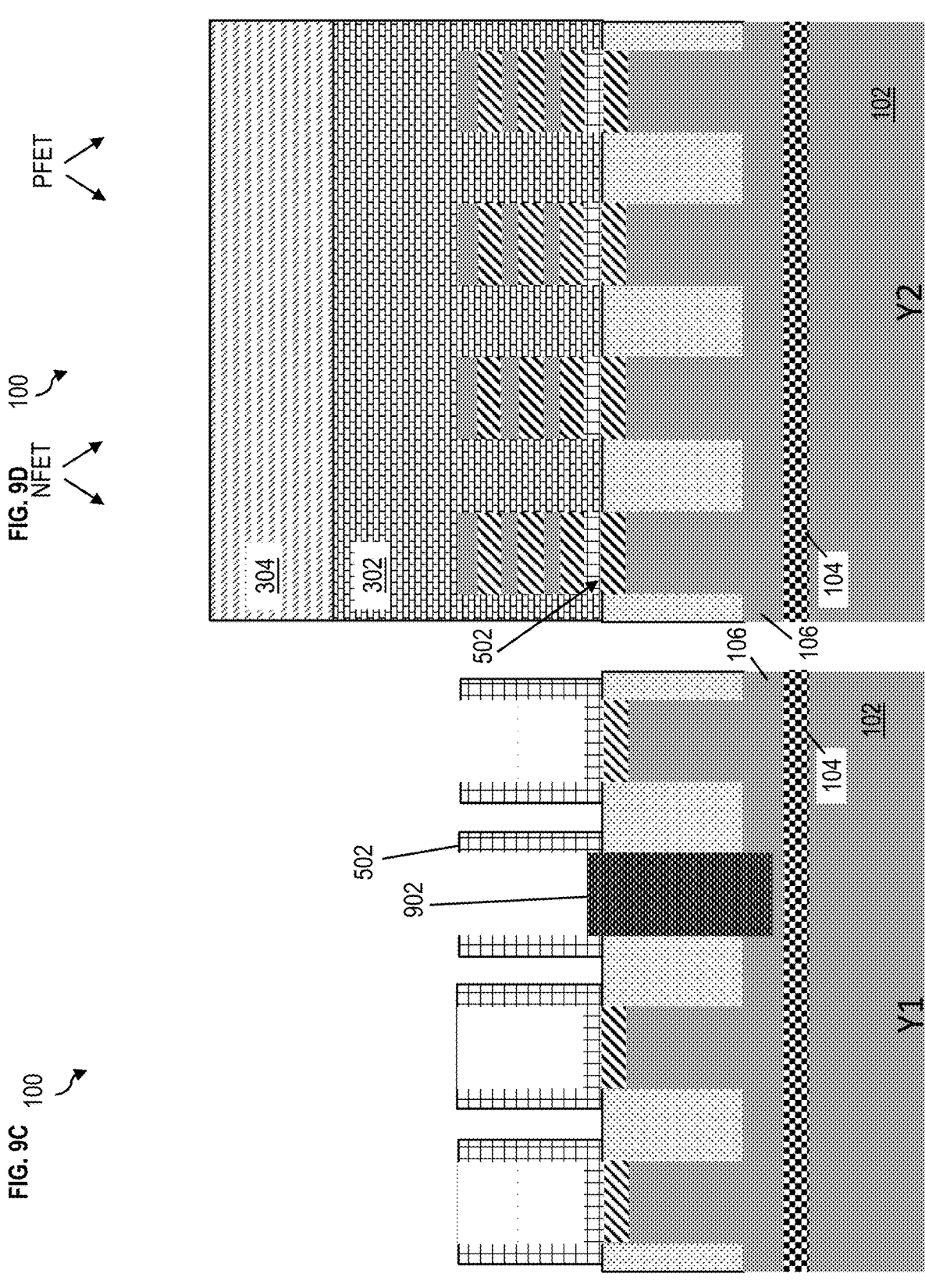
Figure 10B:
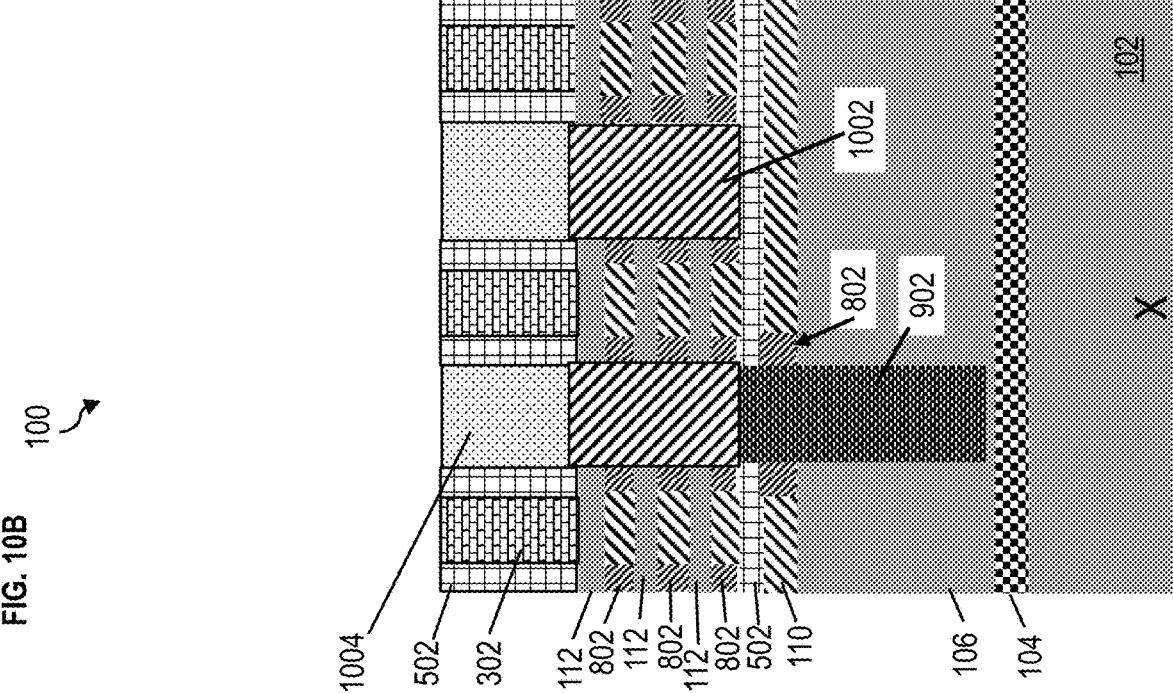
FIGS. 10A, 10B, 10C, and 10D respectively depict a top view and cross-sectional views of a portion of an IC under-fabrication after fabrication operations according to one or more embodiments of the invention.
Figure 10A:
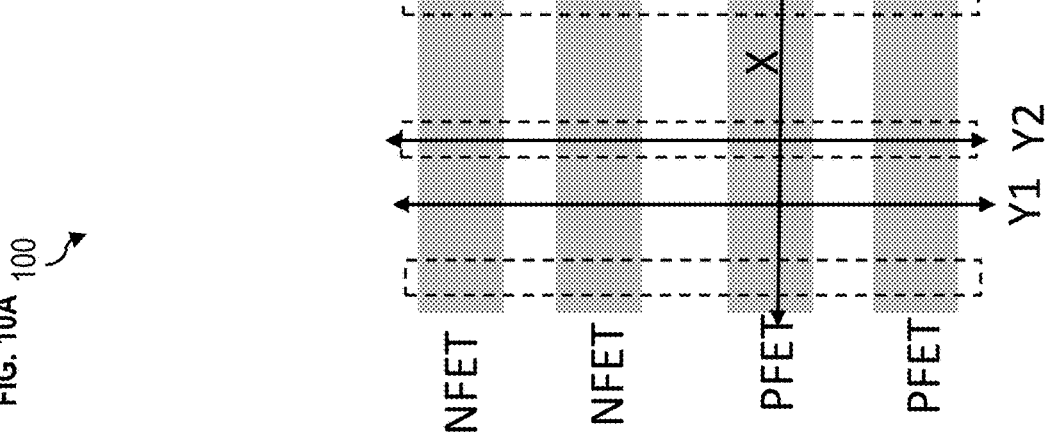
Figure 10D:
Figure 10C:
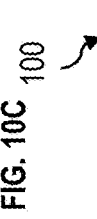
Figure 11B:
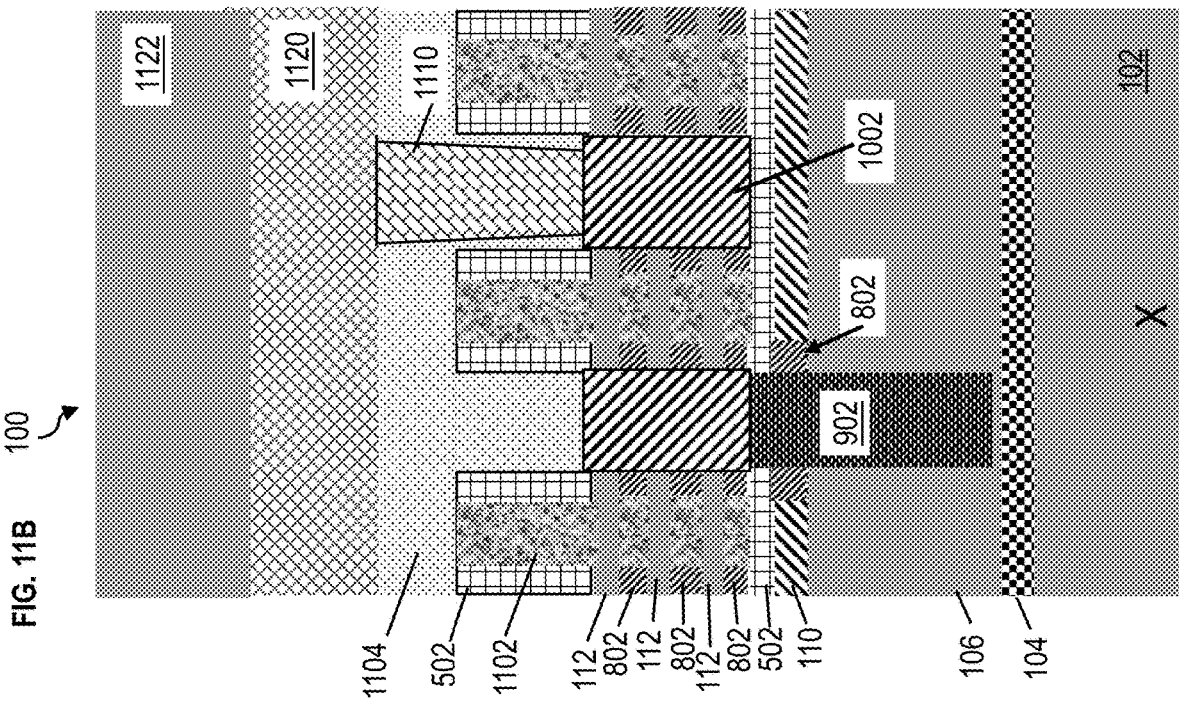
FIGS. 11A, 11B, 11C, and 11D respectively depict a top view and cross-sectional views of a portion of an IC under-fabrication after fabrication operations according to one or more embodiments of the invention.
Figure 11A:
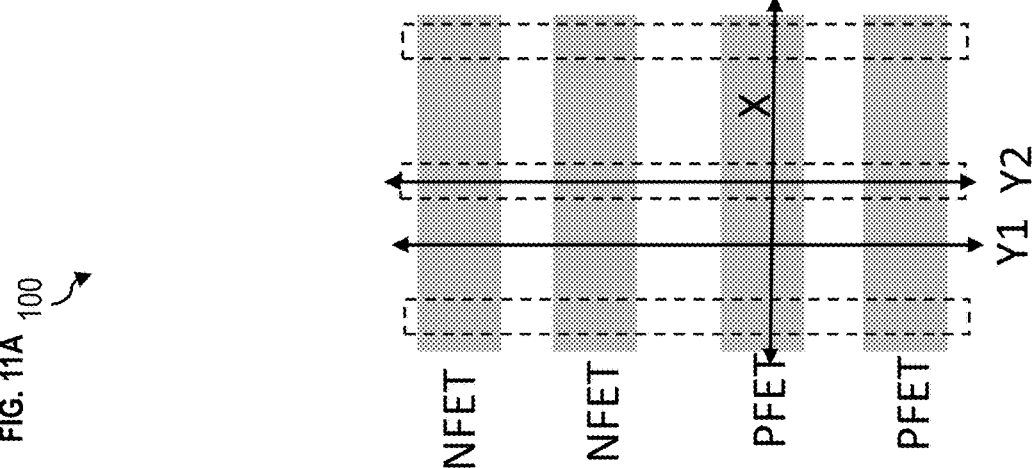
Figures 11C, 11D:
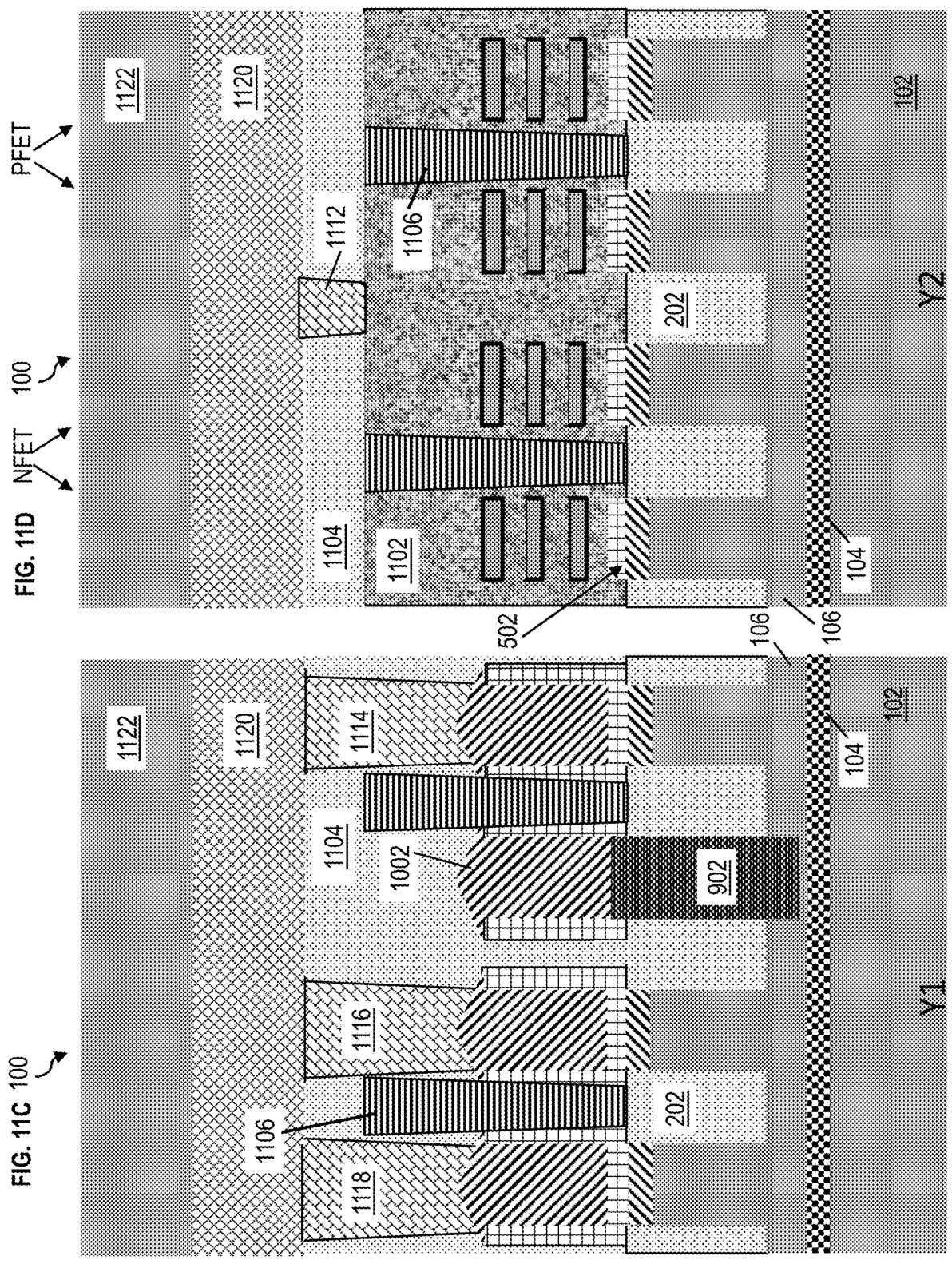
Figure 12B:
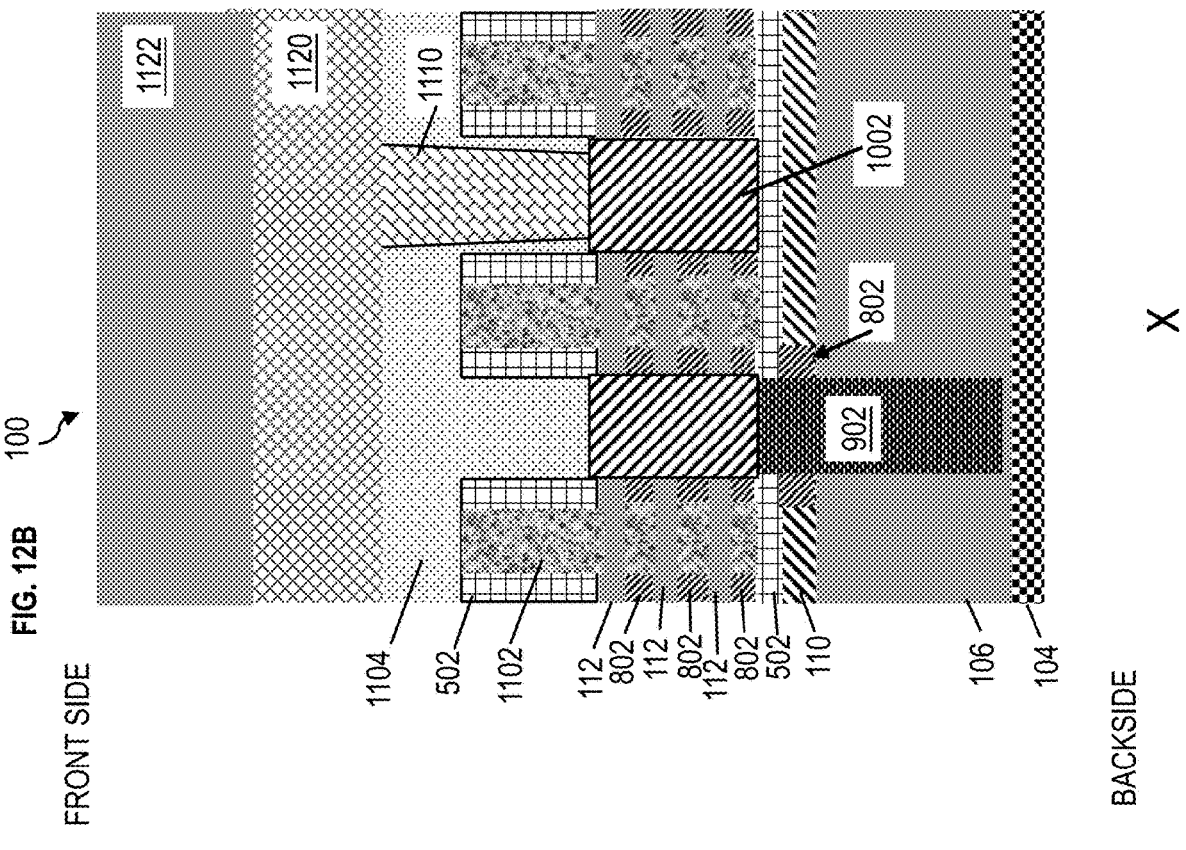
FIGS. 12A, 12B, 12C, and 12D respectively depict a top view and cross-sectional views of a portion of an IC under-fabrication after fabrication operations according to one or more embodiments of the invention.
Figure 12A:
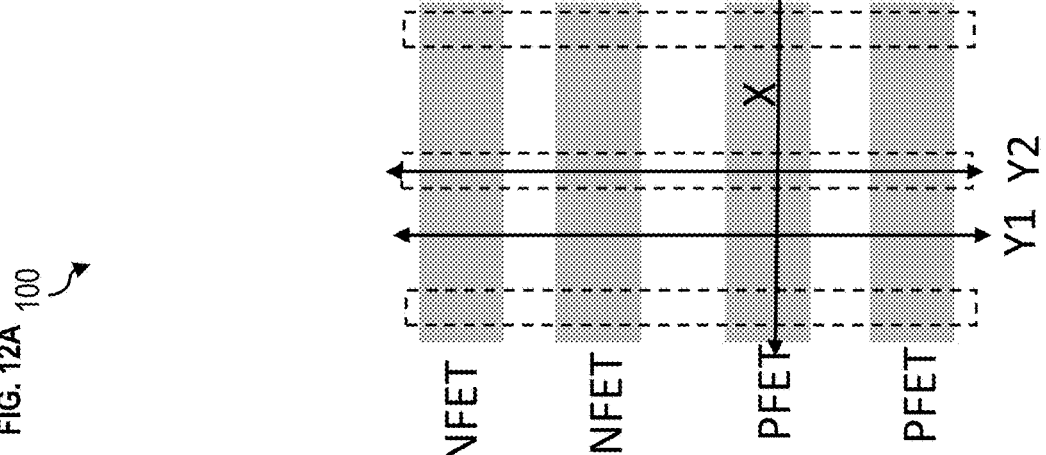
Figures 12C, 12D:
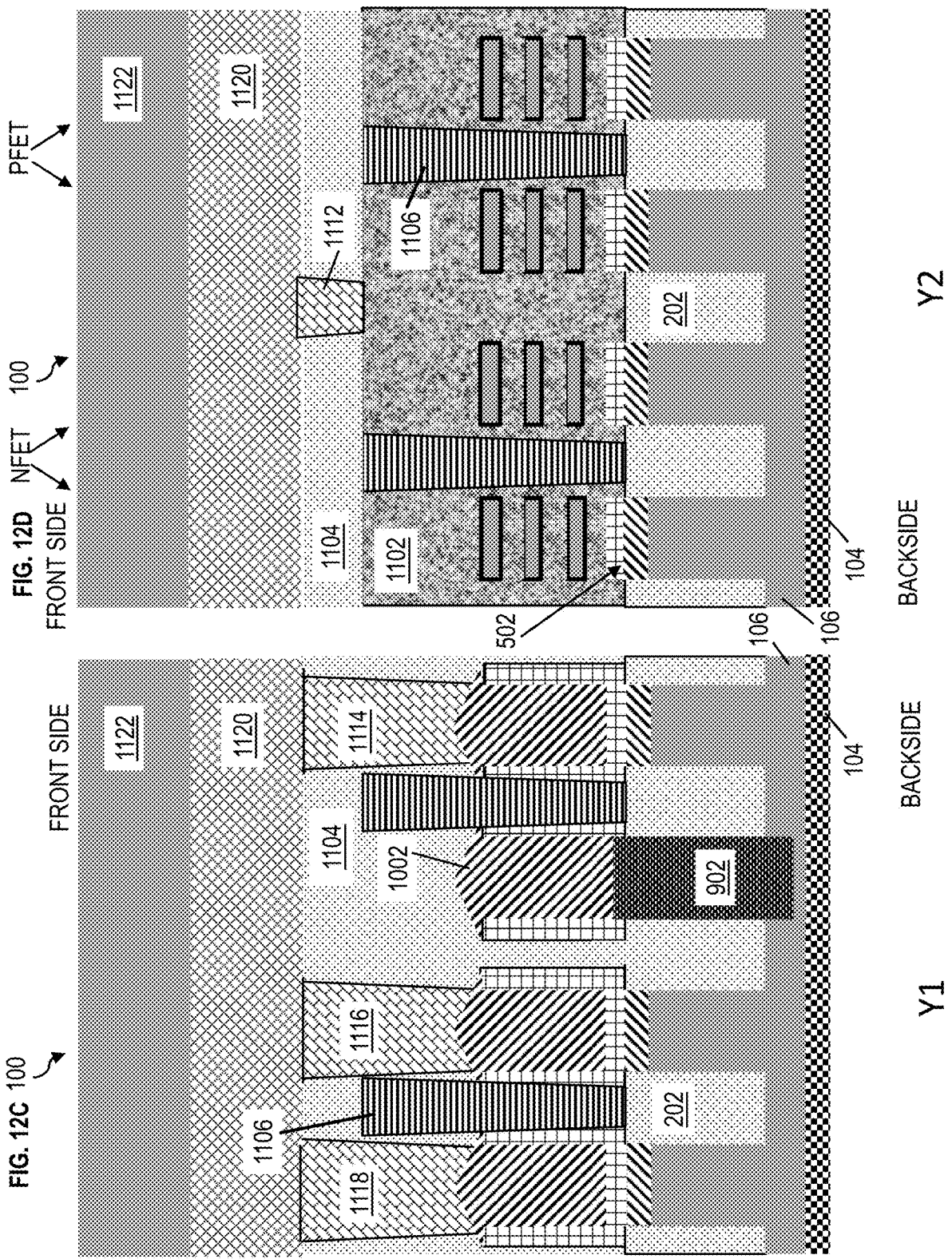
Figure 13B:
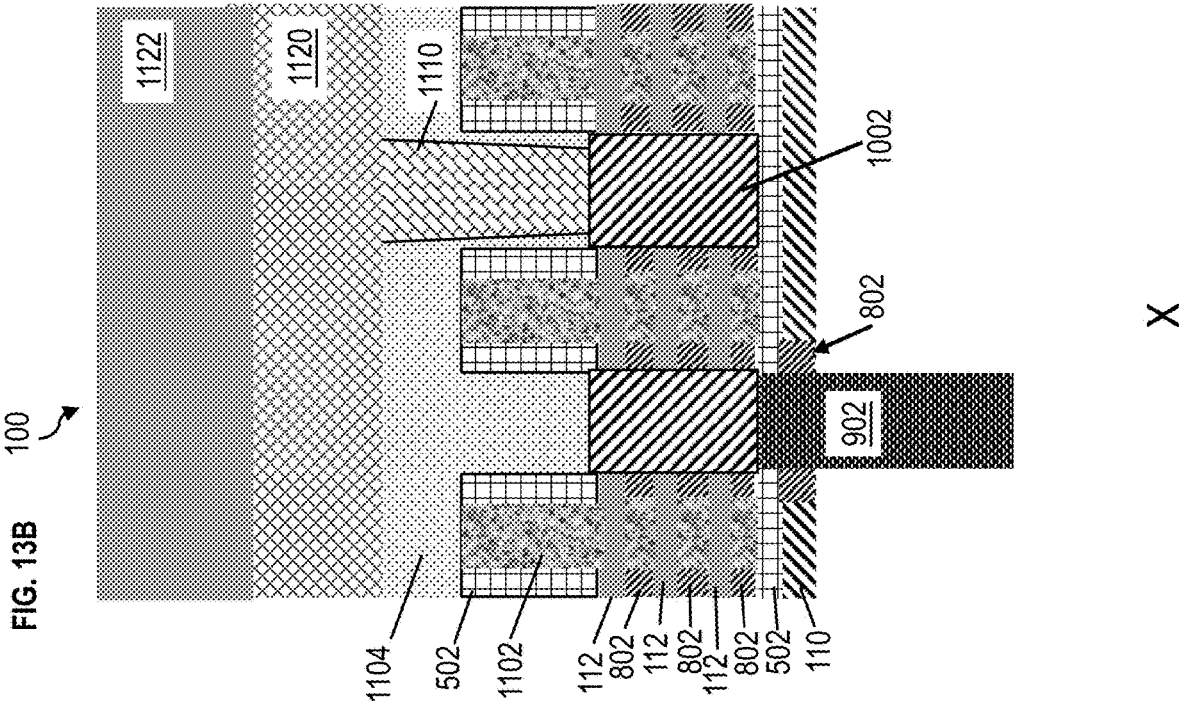
FIGS. 13A, 13B, 13C, and 13D respectively depict a top view and cross-sectional views of a portion of an IC under-fabrication after fabrication operations according to one or more embodiments of the invention.
Figure 13A:
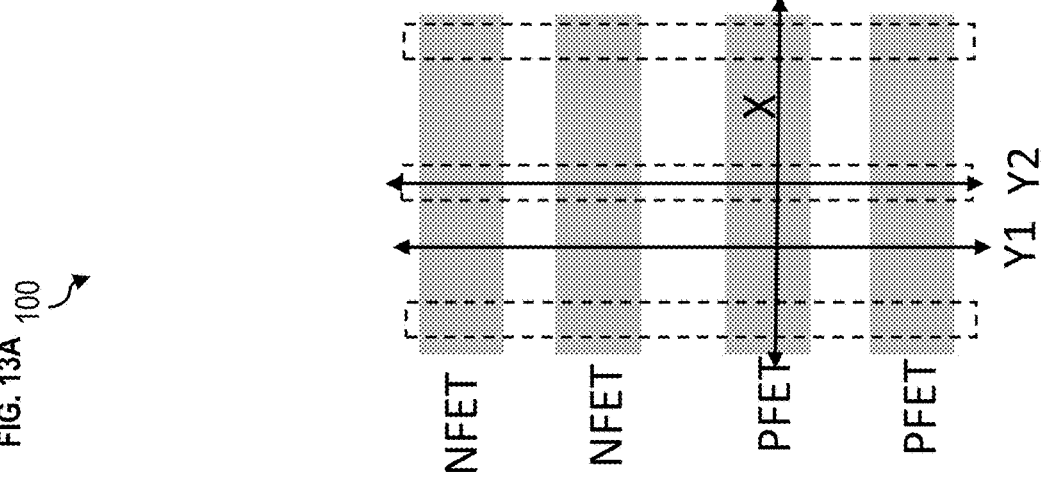
Figures 13C, 13D:
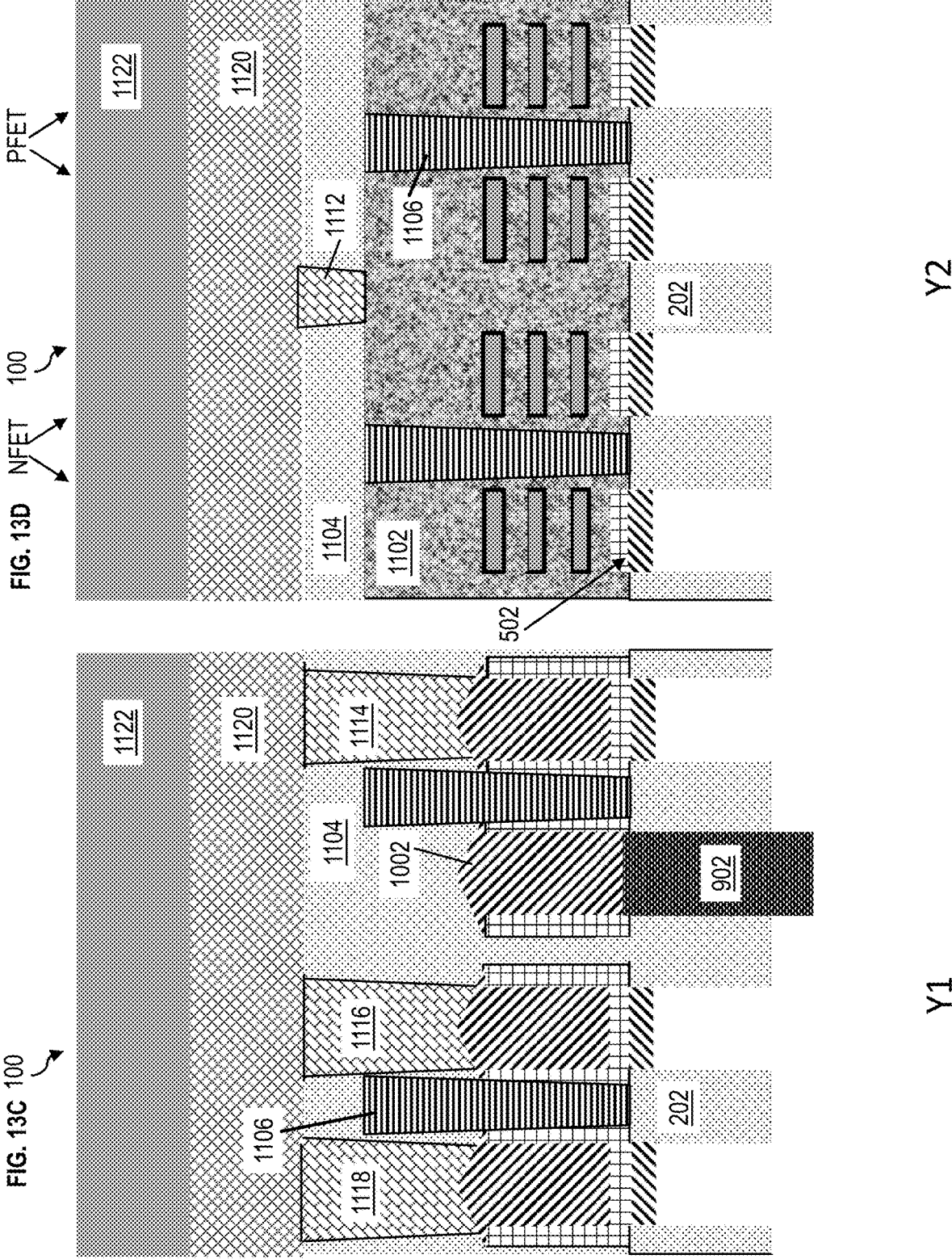
Figures 14A, 14B:
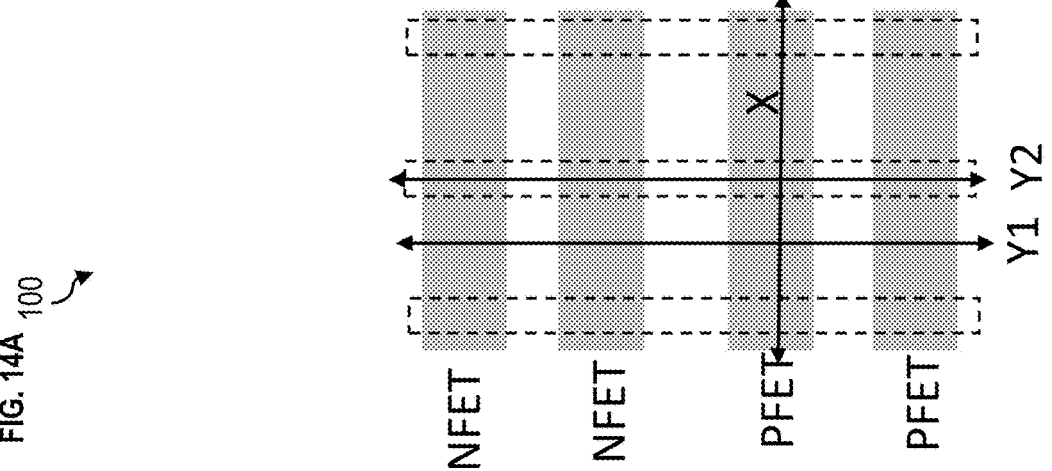
FIGS. 14A, 14B, 14C, and 14D respectively depict a top view and cross-sectional views of a portion of an IC under-fabrication after fabrication operations according to one or more embodiments of the invention.
Figures 14C, 14D:
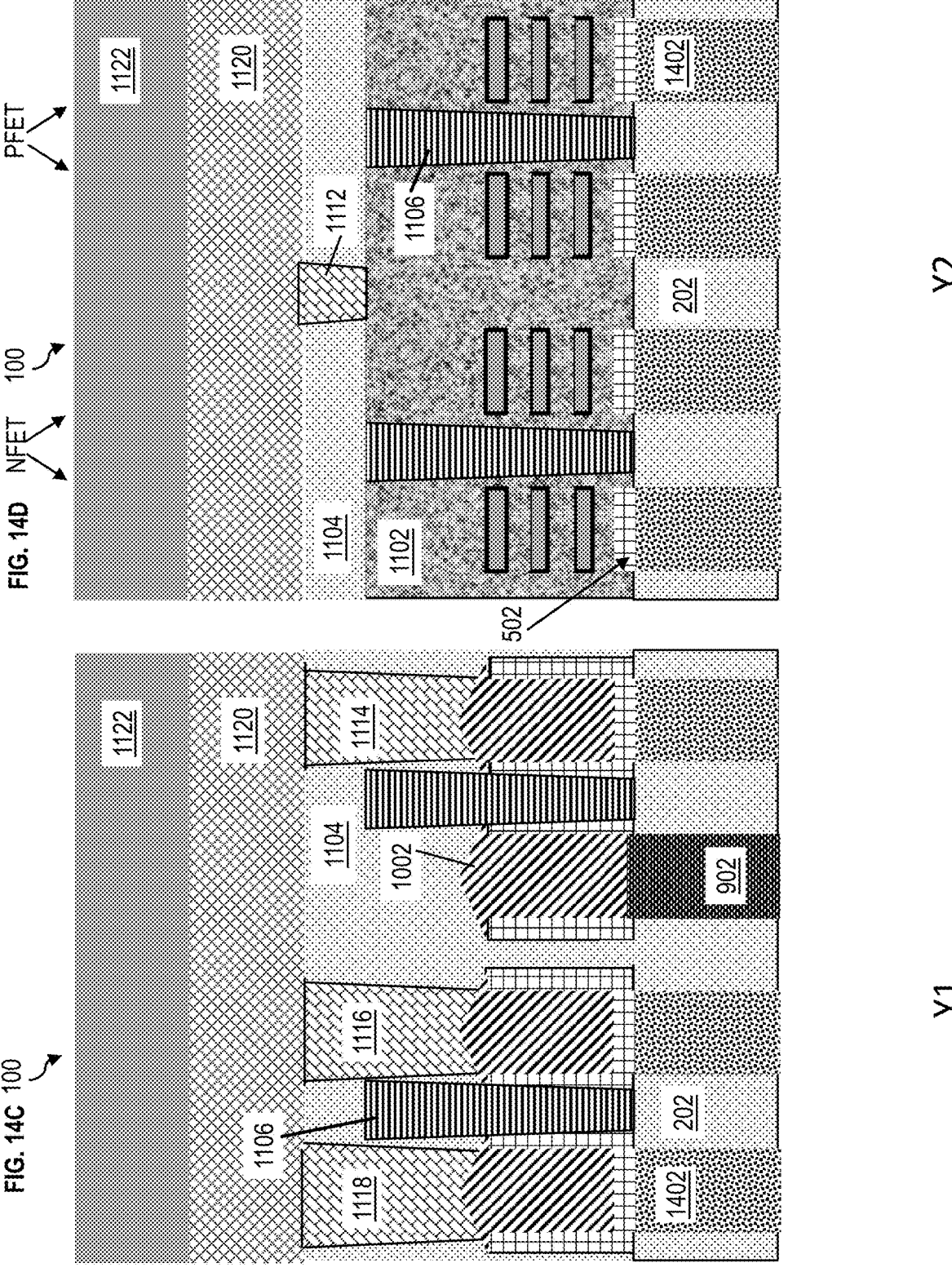
Figure 15B:
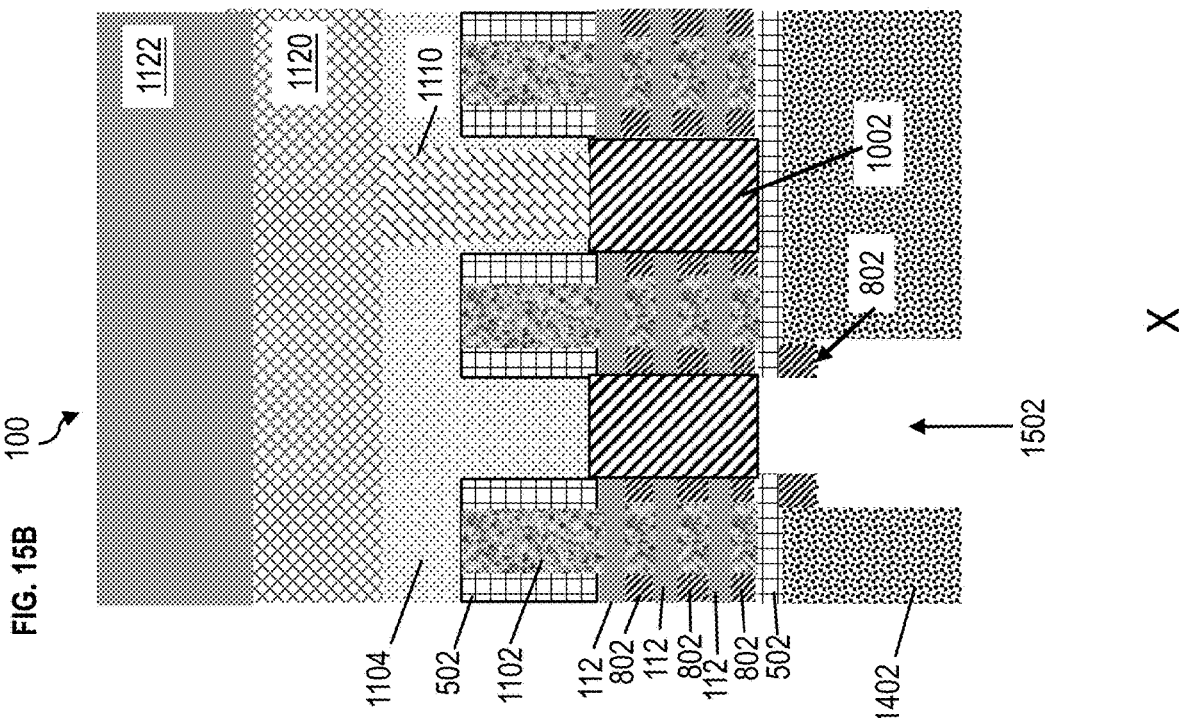
Figure 15A:
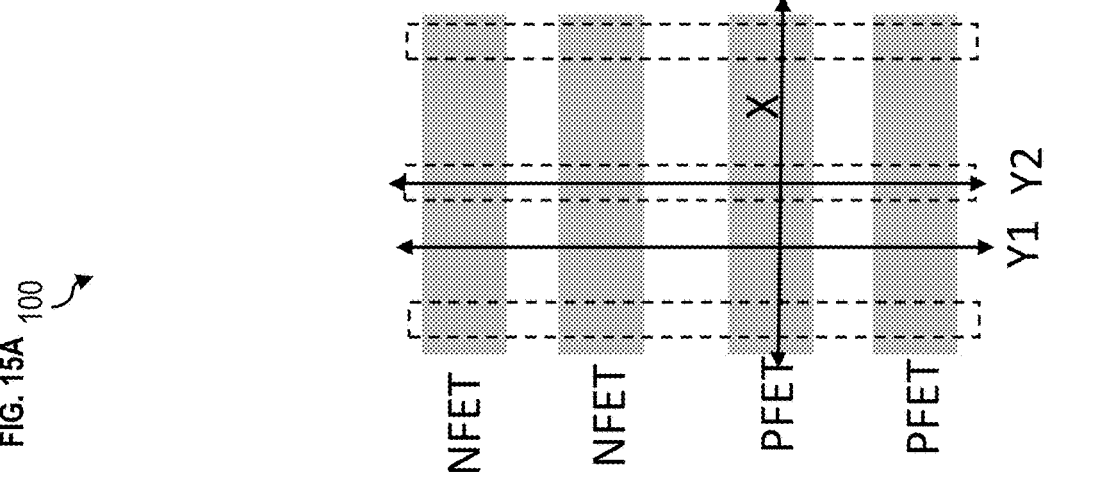
Figure 16B:
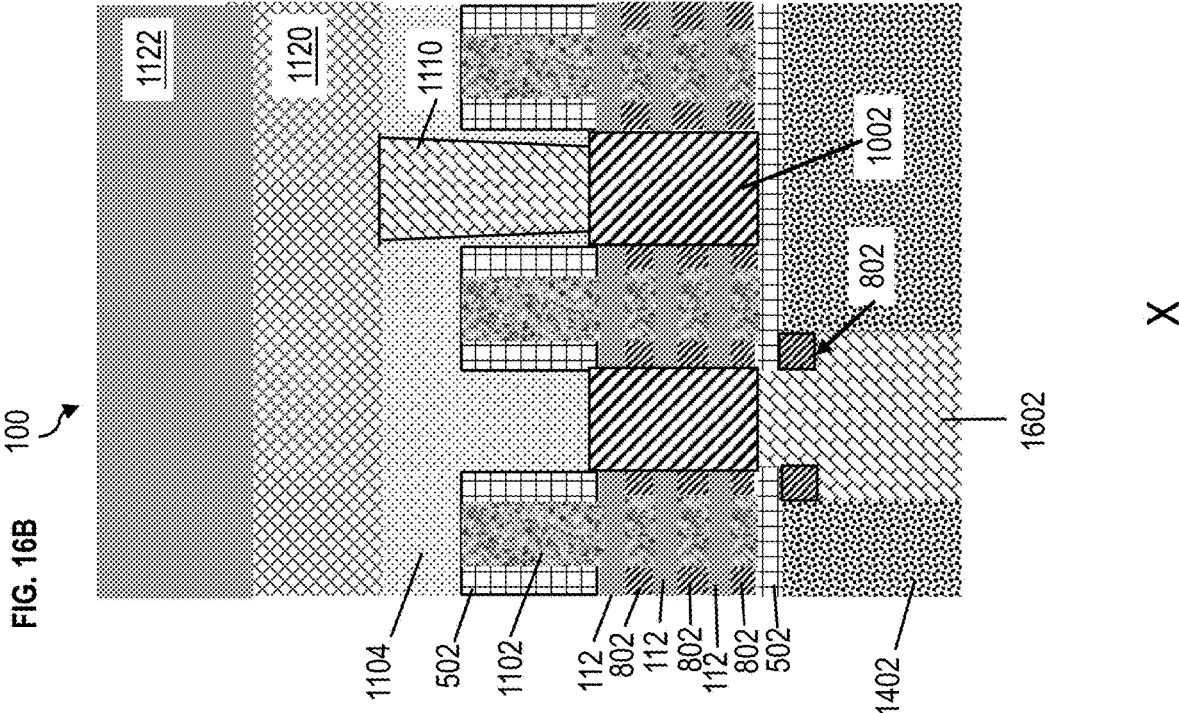
FIGS. 16A, 16B, 16C, and 16D respectively depict a top view and cross-sectional views of a portion of an IC under-fabrication after fabrication operations according to one or more embodiments of the invention.
Figure 16A:
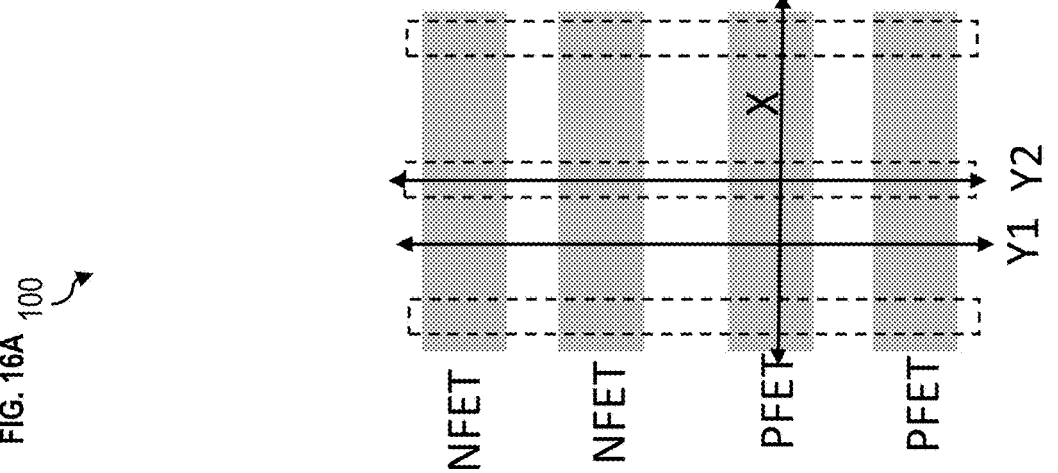
Figures 16C, 16D:
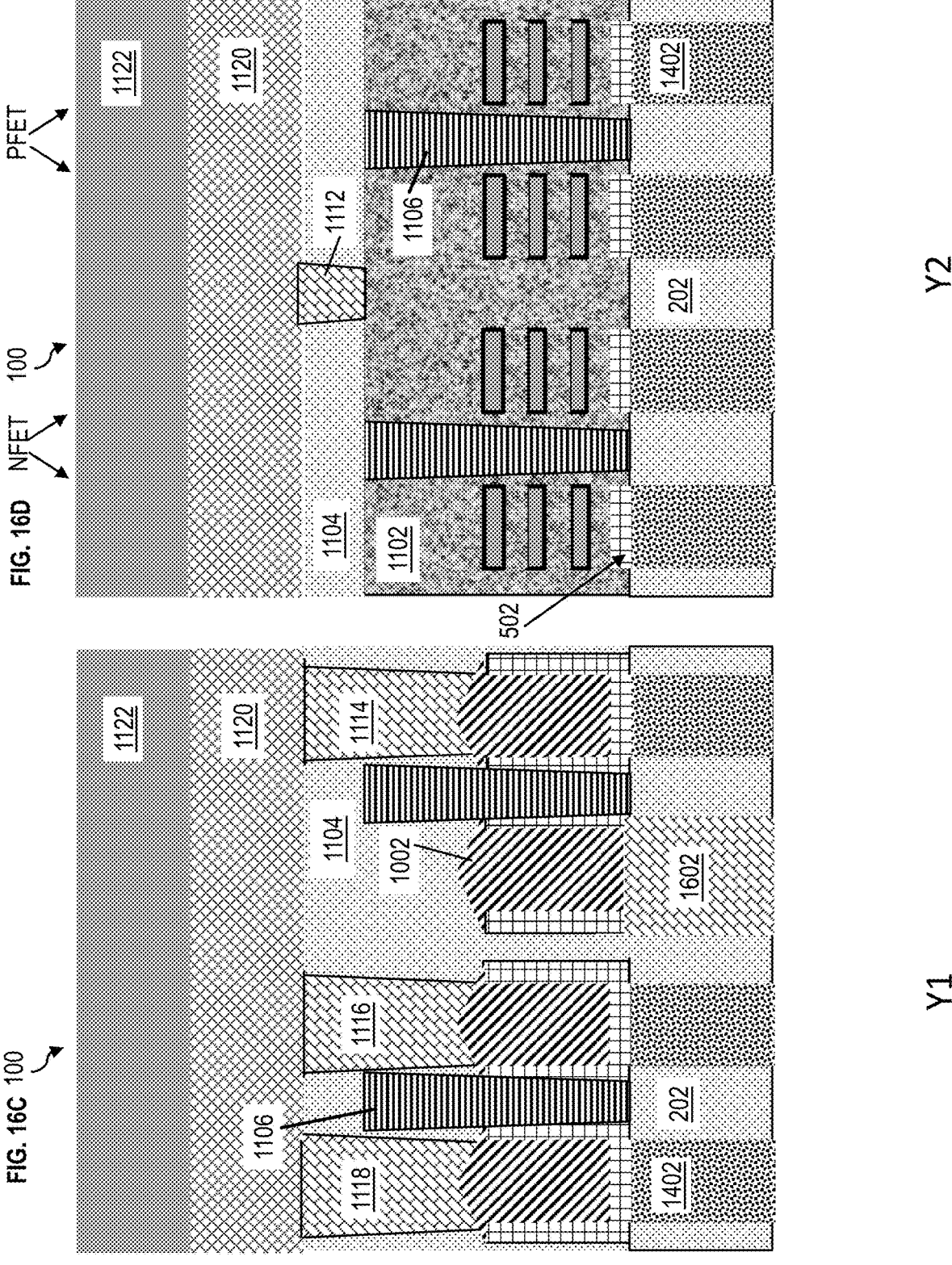
Figure 17B:
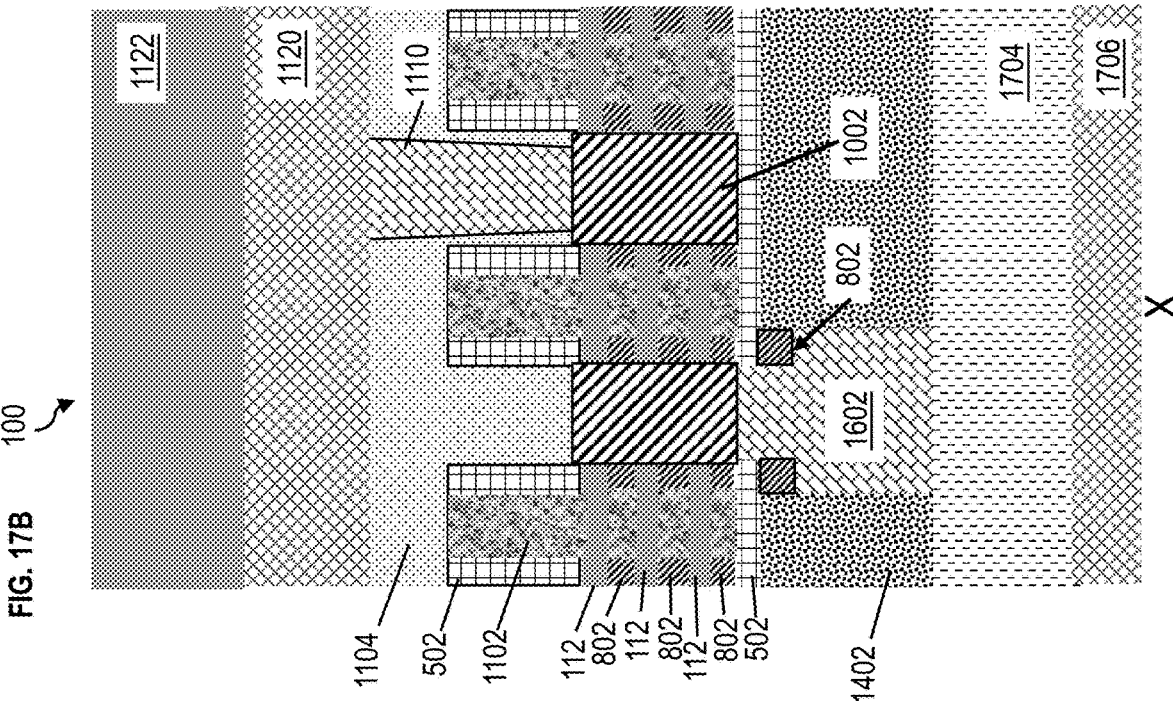
FIGS. 17A, 17B, 17C, and 17D respectively depict a top view and cross-sectional views of a portion of an IC under-fabrication after fabrication operations according to one or more embodiments of the invention.
Figure 17A:
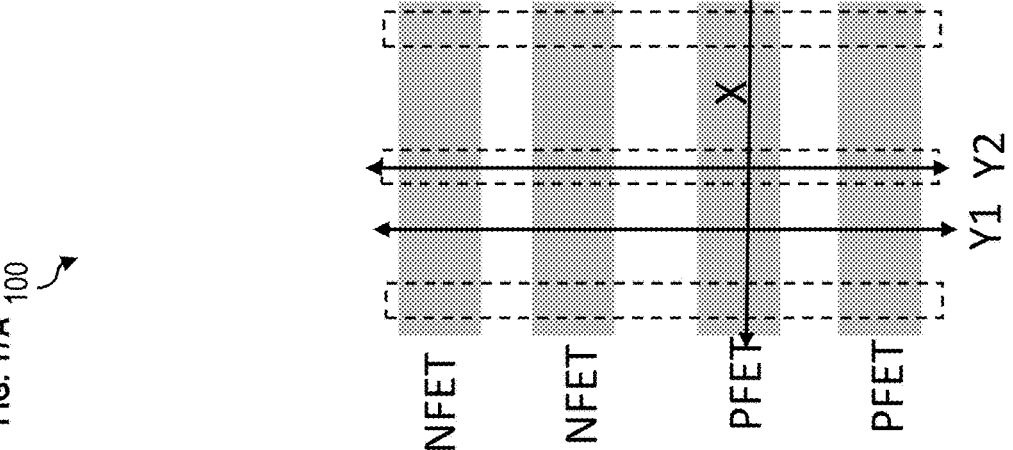
Figures 17C, 17D:
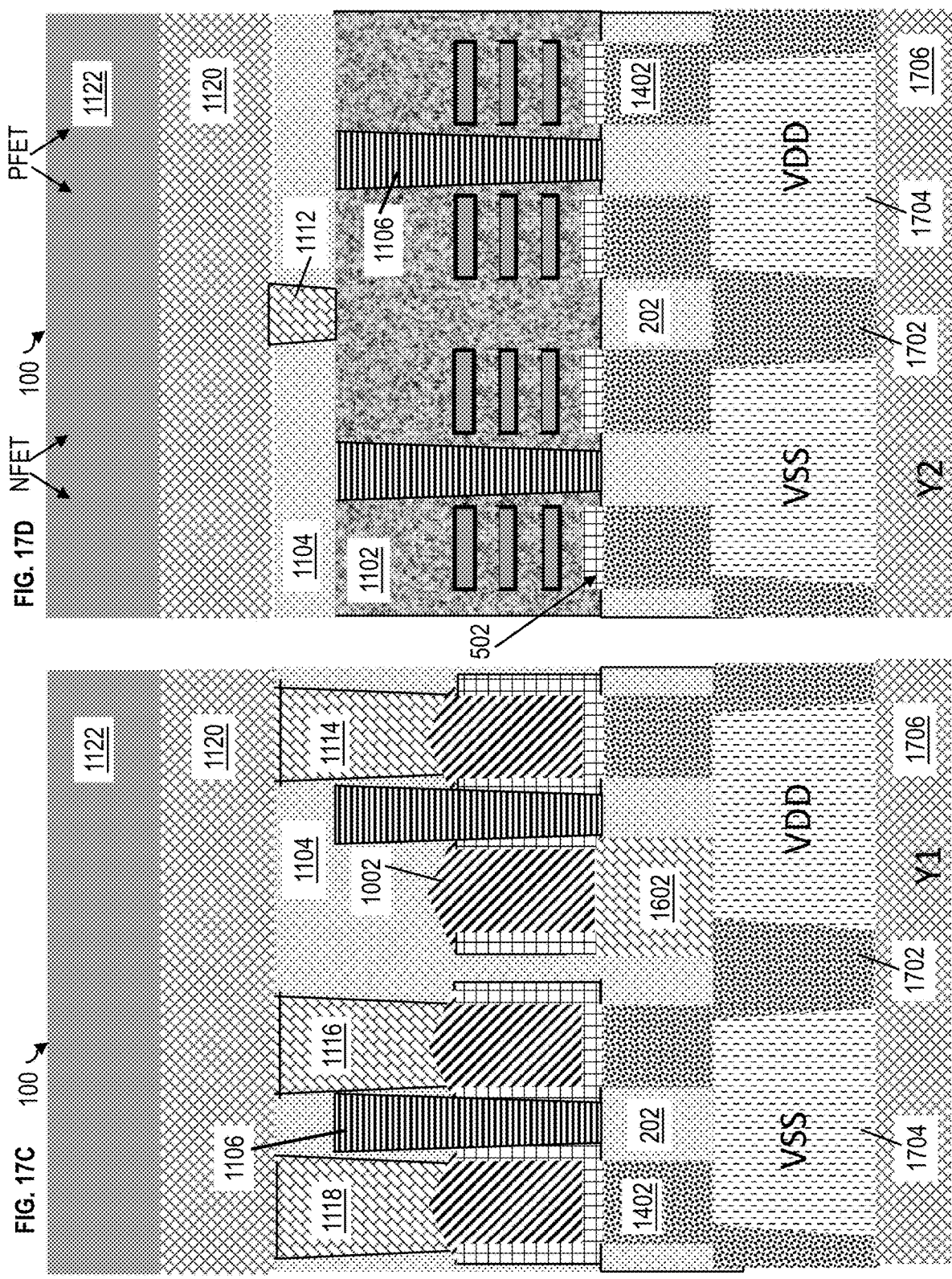

As best seen in FIG. 8B, the bottom most layer 110, which is below the gate spacer material 502 (i.e., bottom dielectric isolation layer), has inner spacers 802 on the ends. The inner spacers 802 on the ends of the bottom most layer 110 provide various benefits. The additional inner spacers 802 on the ends of the bottom most layer 110 protect the gate corner. Also, the bottom most layer 110, which is below the gate spacer material/bottom dielectric isolation layer 502, protects the gate spacer material/bottom dielectric isolation layer 502 and the source/drain epitaxial material during backside silicon removal in subsequent fabrication processing.

FIGS. 9A, 9B, 9C, and 9D depict the IC 100 after forming a sacrificial placeholder. Dielectric material may be deposited and etched to form the sacrificial placeholder 902 in the backside contact trench 704. The top surface of the sacrificial placeholder 902 extends to and/or above the top surface of the bottom most layer 110, i.e., extends to and/or above the top surface of the inner spacers 802 of the bottom most layer 110. Example materials of the sacrificial placeholder 902 may include SiGe, $TiO_x$, $AlO_x$, SiC, etc. If the sacrificial material is SiGe, it can be formed by a bottom-up epitaxial growth process from bottom of the trench 704.

FIGS. 10A, 10B, 10C, and 10D depict the IC 100 after source and drain formation. The epitaxial layers 1002 and 1003 are grown. Interlayer dielectric (ILD) material 1004 is deposited. The gate hard mask layer 304 is removed, and chemical mechanical planarization/polishing (CMP) is performed. The epitaxial layers 1002 may be P-type epitaxial material, resulting in P-type source and drain regions. The epitaxial layers 1003 may be N-type epitaxial material, resulting in N-type source and drain regions. At least one of the epitaxial layers 1002 is formed to sit directly on the placeholder 902.

The ILD material 1004 can be a low-k dielectric material or an ultralow-k dielectric material. Low-k dielectric materials may generally include dielectric materials having a k value of about 3.9 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide (s) such as tetraetehoxysilane (TEOS).

FIGS. 11A, 11B, 11C, and 11D depict the IC 100 after dummy gate removal. The sacrificial gate structures 302 are removed, and the sacrificial layers 110 (SiGe) are released except for the bottom most layer 110. Replacement metal gate (RMG) formation is performed, thereby forming gate regions 1102. The replacement metal gate process is performed to deposit a high-k dielectric material followed by one or more work function material layers to thereby form the gate regions 1102. A gate cut is performed, and the resulting cavities are filled with dielectric material 1106. ILD material 1104 is deposited. The dielectric material used for dielectric material 1106 and/or ILD material 1104 can be a low-k dielectric material or an ultralow-low k dielectric material.

Contact formation is performed for middle of the line (MOL) contacts, resulting in metal contacts 1110, 1112, 1114, 1116, 1118. For example, cavities are formed, and then metal is deposited to fill the cavities thereby forming the metal contacts 1110, 1112, 1114, 1116, 1118. A portion of the metal contacts may include silicide, resulting from the interface of the metal material and semiconductor material. Back-end-of-line (BEOL) layers are formed resulting in BEOL interconnects 1120. A carrier wafer is attached or bonded to the BEOL interconnects 1120.

FIGS. 12A, 12B, 12C, and 12D depict the IC 100 after wafer flip and substrate remove. The front side is the top and the backside refers to the bottom. The following fabrication processes are performed with the backside up and positioned for processing, as understood by one of ordinary skill in the art. However, the front side and backside of the wafer are not flipped in the figures so as not to disorient the reader, although it should be appreciated that the wafer is flipped, and the fabrication is now being performed to the backside. The substrate 102 has been removed, with etching stopping on the etch stop layer 104. The substrate can be removed by a combination of wafer grinding, CMP, and dry/wet etch process. The final stage of the substrate removal process should be selective to etch stop layer, such as ammonia based Si wet etch.

FIGS. 13A, 13B, 13C, and 13D depict the IC 100 after etch stop layer removal. The etch stop layer 104 is removed and the substrate 106 is removed. The bottom most layer 110, as well as its inner spacers 802, provide additional protection for the gate spacer material/bottom dielectric isolation layer 502 during the removal of the substrate 106. Even if there are pin holes in the gate spacer material/bottom dielectric isolation layer 502, the gate spacer material/bottom dielectric isolation layer 502 is protected by the bottom most layer 110 and its inner spacers 802.

FIGS. 14A, 14B, 14C, and 14D depict the IC 100 after removal of the SiGe layer and deposition of backside ILD. The bottom most layer 110 is removed, and backside ILD material 1402 is deposited. The ILD material 1402 can be SiN, SiO2, or a low-k material or ultra-low-k material. CMP is performed.

FIGS. 15A, 15B, 15C, and 15D depict the IC 100 after sacrificial placeholder removal and a backside contact pre-clean. The sacrificial placeholder 902 is removed, leaving a cavity 1502. A cleaning process is performed on the backside in preparation for the backside contact formation. The additional inner spacers 802, which are below the gate spacer material/bottom dielectric isolation layer 502, protect the gate corner of the gate regions 1102 from all clean processes, like SiCoNi, diluted hydrofluoric acid (DHF), Ar sputtering, etc. There can be pin holes in the gate spacer material/bottom dielectric isolation layer 502 and the bottom most inner spacers 802 that form sides of the cavity 1502 protect the gate spacer material/bottom dielectric isolation layer 502. Accordingly, the bottom most inner spacers 802 may be referred to as backside protective spacers.

FIGS. 16A, 16B, 16C, and 16D depict the IC 100 after on the backside contact metallization. A backside contact 1602 is formed in the cavity 1502 so as to physically and electrically contact the epitaxial layer 1002. The backside contact 1602 may be formed of a silicide and metal.

FIGS. 17A, 17B, 17C, and 17D depict the IC 100 after forming backside power rails and backside power distribution network. Backside power rails 1704 are formed to connect to respective backside contacts (including the backside contact 1602), and the backside power distribution network 1706 connects to various backside power rails, as understood by one or ordinary skill in the art.

Although examples illustrate a single backside contact 1602 connected to a PFET, it should be appreciated that an IC has numerous backside contacts 1602 connected to numerous PFETs and NFETs. There can be hundreds, thousands, or millions of transistors in an IC, each having their own contacts including backside contacts 1602.

Figure 18:
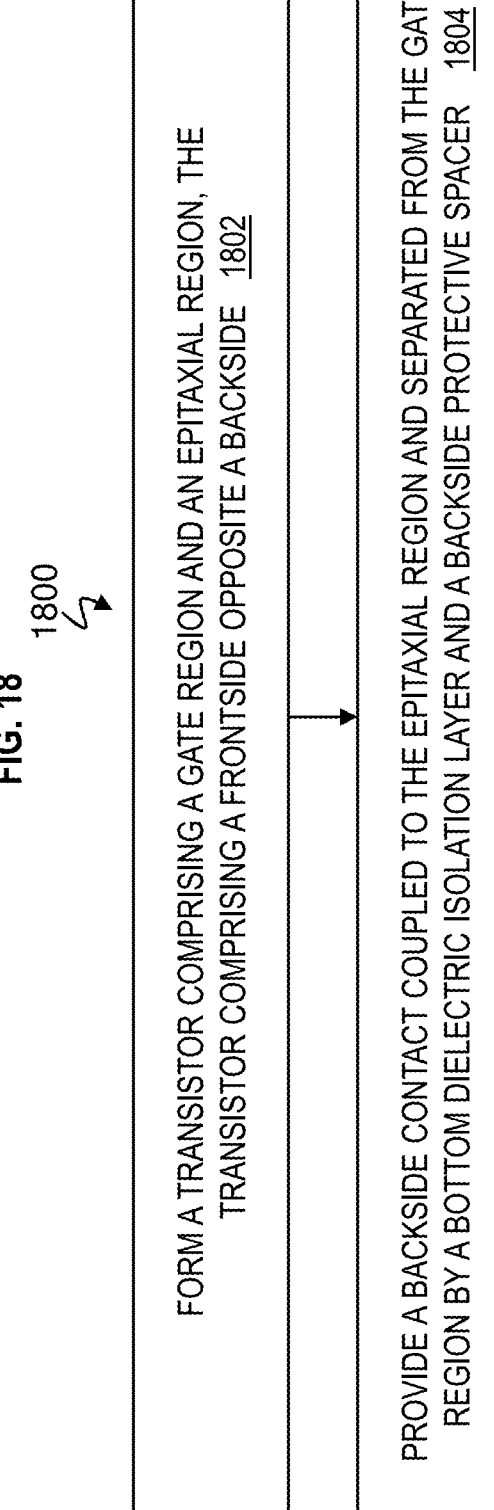
FIG. 18 is a flowchart of a computer-implemented method of forming a backside contact that reduces the risk of contact to gate short according to one or more embodiments of the invention.

FIG. 18 is a flowchart of a computer-implemented method 1800 for a backside contact that reduces the risk of contact to gate short according to one or more embodiments. At block 1802, the method 1800 includes forming a transistor (e.g., NFETs and PFETs) comprising a gate region 1102 and an epitaxial region (e.g., epitaxial layers 1002 and 1003), the transistor comprising a frontside opposite a backside. At block 1804, the method 1800 includes providing a backside contact 1602 coupled to the epitaxial region (e.g., epitaxial layers 1002 and 1003) and separated from the gate region 1102 by a bottom dielectric isolation layer (e.g., gate spacer material 502) and a backside protective spacer (e.g., the lowest most inner spacers 802 for the transistor).

Further, the backside protective spacer (e.g., the lowest most inner spacers 802) is formed under the bottom dielectric isolation layer (e.g., gate spacer material 502), substantially aligned with an inner spacer (e.g., inner spacer 802 adjacent to the gate regions 1102). The backside contact protective spacer (e.g., the lowest most inner spacers 802 adjacent to the backside contact 1602) is substantially a width and a material of an inner spacer (e.g., inner spacer 802 adjacent to the gate regions 1102).

An inner spacer is formed between channel regions (e.g., layer 112) of the transistor. The backside contact 1602 forms an inverted "T" shape, with a transition region adjacent to the backside protective spacer (e.g., the lowest most inner spacers 802 adjacent to the backside contact 1602). A front side contact (e.g., metal contact 1110) is coupled to another epitaxial region of the transistor. The backside contact 1602 is on the backside of the transistor and a front side contact (e.g., metal contact 1110) is on the front side.

The backside protective spacer (e.g., the lowest most inner spacers 802 adjacent to the backside contact 1602) comprises as an insulator material. The backside protective spacer (e.g., the lowest most inner spacers 802 adjacent to the backside contact 1602) and the bottom dielectric isolation layer (e.g., gate spacer material 502) comprise different materials. The backside protective spacer (e.g., the lowest most inner spacers 802 adjacent to the backside contact 1602) is adjacent to the bottom dielectric isolation layer (e.g., gate spacer material 502).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20-C). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a" "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
a transistor comprising a gate region, an inner spacer material forming inner spacers adjacent to channel regions, and an epitaxial region, the transistor comprising a frontside opposite a backside; and a backside contact coupled to the epitaxial region and separated from the gate region by a bottom dielectric isolation layer and a backside protective spacer, wherein the bottom dielectric isolation layer and the backside protective spacer are in contact with the backside contact and are positioned below the inner spacers, wherein the inner spacers are on a first side of the bottom dielectric isolation layer and the backside protective spacer is on a second side of the bottom dielectric isolation layer, the second side being opposite the first side;

wherein the backside protective spacer is substantially a width and a material of an inner spacer.

2. The semiconductor structure of claim 1, wherein the bottom dielectric isolation layer extends a length of the channel regions.

3. The semiconductor structure of claim 1, wherein an inner spacer is formed between channel regions of the transistor.

4. The semiconductor structure of claim 1, wherein the backside contact forms an inverted T shape, with a transition region adjacent to the backside protective spacer.

5. The semiconductor structure of claim 1, wherein a front side contact is coupled to another epitaxial region of the transistor.

6. The semiconductor structure of claim 1, wherein the backside contact is on the backside of the transistor and a front side contact is on the front side.

7. The semiconductor structure of claim 1, wherein the backside protective spacer comprises an insulator material.

8. The semiconductor structure of claim 1, wherein the backside protective spacer and the bottom dielectric isolation layer comprise different materials.

9. The semiconductor structure of claim 1, wherein the backside protective spacer is adjacent to the bottom dielectric isolation layer.

10. A method comprising:
forming a transistor comprising a gate region, an inner spacer material forming inner spacers adjacent to channel regions, and an epitaxial region, the transistor comprising a frontside opposite a backside; and providing a backside contact coupled to the epitaxial region and separated from the gate region by a bottom dielectric isolation layer and a backside protective spacer, wherein the bottom dielectric isolation layer and the backside protective spacer are in contact with the backside contact and are positioned below the inner spacers, wherein the inner spacers are on a first side of the bottom dielectric isolation layer and the backside protective spacer is on a second side of the bottom dielectric isolation layer, the second side being opposite the first side;

wherein the backside protective spacer is substantially a width and a material of an inner spacer.

11. The method of claim 10, wherein the backside protective spacer is formed under the bottom dielectric isolation layer, substantially aligned with an inner spacer.

12. The method of claim 10, wherein an inner spacer is formed between channel regions of the transistor.

13. The method of claim 10, wherein the backside contact forms an inverted T shape, with a transition region adjacent to the backside protective spacer.

14. The method of claim 10, wherein a front side contact is coupled to another epitaxial region of the transistor.

15. The method of claim 10, wherein the backside contact is on the backside of the transistor and a front side contact is on the front side.

16. The method of claim 10, wherein the backside protective spacer comprises an insulator material.

17. The method of claim 10, wherein the backside protective spacer and the bottom dielectric isolation layer comprise different materials.

18. The method of claim 10, wherein the backside protective spacer is adjacent to the bottom dielectric isolation layer.

\* \* \* \* \*